(12) United States Patent
Cho et al.

(10) Patent No.: US 7,915,689 B2
(45) Date of Patent: Mar. 29, 2011

(54) THIN FILM TRANSISTOR, DISPLAY DEVICE INCLUDING THE SAME AND MANUFACTURING METHOD THEREOF

(75) Inventors: Sung-Haeng Cho, Chungcheongbuk-do (KR); Ki-Hun Jeong, Seoul (KR); Jun-Ho Song, Seongnam-si (KR); Joo-Han Kim, Yongin-si (KR); Hyung-Jun Kim, Seoul (KR); Seung-Hwan Shim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 12/260,464

(22) Filed: Oct. 29, 2008

(65) Prior Publication Data
US 2009/0152554 A1    Jun. 18, 2009

(30) Foreign Application Priority Data
Dec. 18, 2007  (KR) .................. 10-2007-0133679

(51) Int. Cl.
*H01L 29/786*     (2006.01)

(52) U.S. Cl. .......... 257/390; 257/E29.289; 257/E29.292

(58) Field of Classification Search .................. 257/390, 257/E27.081, E29.273, E29.288, E29.289, 257/E29.292, E29.299
See application file for complete search history.

(56) References Cited

U.S. PATENT DOCUMENTS

| | | | | |
|---|---|---|---|---|
| 6,204,519 B1 * | 3/2001 | Yamazaki et al. | ............... | 257/72 |
| 2005/0218403 A1 * | 10/2005 | Kuo | ............................... | 257/59 |
| 2007/0242176 A1 * | 10/2007 | Chang et al. | .................... | 349/42 |
| 2008/0173871 A1 * | 7/2008 | Noda et al. | ...................... | 257/59 |

* cited by examiner

*Primary Examiner* — Benjamin P Sandvik
*Assistant Examiner* — W. Wendy Kuo
(74) *Attorney, Agent, or Firm* — Cantor Colburn LLP

(57) ABSTRACT

A thin film transistor, a display device, and a manufacturing method thereof. The thin film transistor includes a control electrode, a semiconductor overlapping the control electrode, and an input electrode and an output electrode disposed on or under the semiconductor and opposite to each other. The semiconductor includes a first portion disposed between the input electrode and the output electrode and having a first crystallinity, and a second portion connected with the first portion, which overlaps the input electrode or the output electrode, and having a second crystallinity. The first crystallinity is higher than the second crystallinity.

6 Claims, 20 Drawing Sheets

THIN FILM TRANSISTOR, DISPLAY DEVICE INCLUDING THE SAME AND MANUFACTURING METHOD THEREOF

This application claims priority to Korean Patent Application No. 10-2007-0133679 filed on Dec. 18, 2007, and all of the benefits accruing under 35 U.S.C. §119, and the contents of which in its entirety are herein incorporated by reference.

BACKGROUND OF THE INVENTION

1. Field of the Invention

The present invention relates to a thin film transistor, a display device including the same, and a manufacturing method thereof.

2. Description of the Related Art

A display device such as a liquid crystal display ("LCD"), an organic light emitting diode display ("OLED display"), and an electrophoretic display include a plurality of pixels. Each pixel includes a pair of field generating electrodes and an optical active layer formed therebetween. The LCD includes a liquid crystal capacitor having a liquid crystal layer as the optical active layer formed between the field generating electrodes, and the OLED display includes an organic light emitting diode having an organic emission layer as the optical active layer between the field generating electrodes.

The conventional display device includes a switching element connected to one of the pair of the field generating electrodes to control electric signals, and the optical active layer converts the electric signals into optical signals, to thereby display images. The switching element receives data signals from a data line and transmits them to a pixel electrode according to a scanning signal from a gate line, and mainly uses a thin film transistor ("TFT").

The field generating electrode, the switching element, the gate line, and the data line are formed on at least one of display panels.

The display device also includes a gate driver applying scanning signals to the gate line and a data driver applying data signals to the data line. The gate driver and data driver are also operated according to signals transmitted from a signal controller, and may be formed on the display panel along with the field generating electrodes and the switching element. These drivers include a plurality of active elements made of TFTs.

Further, the OLED display further includes a driving transistor to flow the current to the organic light emitting diode according to the data signal transmitted from the switching element as well as the switching element.

However, the TFT of the pixel and the TFT of the driver have different characteristics, and the switching transistor and the driving transistor require different characteristics in the OLED display. For example, some TFTs are required to have a high on/off current ratio ($I_{on}/I_{off}$), and other TFTs are required to have high charge mobility.

However, these characteristics are traded off such that it is difficult for TFTs having the same structure to simultaneously satisfy these characteristics.

To form the various TFTs having the different characteristics on one display panel, TFTs having different structures may be manufactured through different processes and different apparatus, but the manufacturing process is complicated and the cost and time are required remarkably increased.

BRIEF SUMMARY OF THE INVENTION

The present invention has been made in an effort to solve the above-stated problem, and aspects of the present invention provide a thin film transistor, a display device including the same, and a manufacturing method thereof, capable of forming a plurality of thin film transistors having different characteristics through one manufacturing method and one apparatus.

In an exemplary embodiment, the present invention provides a thin film transistor including a control electrode, a semiconductor which overlaps the control electrode, and an input electrode and an output electrode disposed adjacent to the semiconductor and opposite to each other, the semiconductor includes a first portion disposed between the input electrode and the output electrode and having a first crystallinity, and a second portion connected to the first portion, overlapping the input electrode or the output electrode, and having a second crystallinity. The first crystallinity is higher than the second crystallinity.

According to an exemplary embodiment, the first portion of the semiconductor is thinner than the second portion.

According to an exemplary embodiment, the thickness of the first portion of the semiconductor is in a range of approximately 300 to approximately 1500 Å.

According to an exemplary embodiment, the thin film transistor is disposed in at least one of a gate driver and a data driver.

In another exemplary embodiment, the present invention provides a display device including a first thin film transistor including a first control electrode, a first semiconductor which overlaps the first control electrode, and a first input electrode and a first output electrode opposite to each other adjacent to the first semiconductor, and a second thin film transistor including a second control electrode, a second semiconductor which overlaps the second control electrode, and a second input electrode and a second output electrode opposite to each other on or under the second semiconductor. The first semiconductor includes a first portion disposed between the first input electrode and the first output electrode and having a first crystallinity, and a second portion which overlaps the first input electrode or the first output electrode and having a second crystallinity. The first crystallinity is higher than the second crystallinity.

According to an exemplary embodiment, the second semiconductor includes a third portion disposed between the second input electrode and the second output electrode and a fourth portion which overlaps the second input electrode and the second output electrode. According to an exemplary embodiment, the third portion and the fourth portion include amorphous semiconductor.

According to an exemplary embodiment, the first portion is thinner than the second portion, and the third portion is thinner than the fourth portion.

According to an exemplary embodiment, the thickness of the first portion is in the range of approximately 300 to approximately 1500 Å.

According to an exemplary embodiment, the display device further includes a gate insulating layer disposed between the first and second control electrodes and the first and second semiconductors, the gate insulating layer includes a fifth portion disposed under the first semiconductor and the second semiconductor, and a sixth portion except the fifth portion, and the sixth portion is thinner than the fifth portion.

According to an exemplary embodiment, the first thin film transistor is disposed in a driving unit, the second thin film transistor is disposed in a display unit, the driving unit includes a gate driver connected to the first signal line and a data driver connected to the second signal line intersecting the first signal line, and the first signal line and the second signal line are connected to the second thin film transistor.

According to an exemplary embodiment, the display device further includes a first electrode connected to the first thin film transistor, a second electrode opposite to the first electrode, and an organic emission layer formed between the first electrode and the second electrode. The first control electrode is electrically connected to the second output electrode.

In another exemplary embodiment, the present invention provides a manufacturing method of a display device. The method includes forming first and second control electrodes, forming first and second semiconductors and first and second ohmic contact layers on the first and second control electrodes, respectively forming a pair of a first input electrode and a first output electrode and a pair of a second input electrode and a second output electrodes on the first and second ohmic contact layers, removing the first ohmic contact layer between the first input electrode and the first output electrode and the second ohmic contact layer between the second input electrode and the second output electrode to expose the first and second semiconductors, and irradiating a laser on the exposed portion of the first semiconductor.

According to an exemplary embodiment, the irradiating of the laser on the exposed portion of the first semiconductor is executed by using the first input electrode and the first output electrode as a mask.

According to an exemplary embodiment, the forming of the first and second input electrodes and the first and second output electrodes includes patterning by photolithography using a plurality of photoresist patterns, and the irradiating of the laser on the exposed portion of the first semiconductor is executed by using the photoresist patterns as a mask.

According to an exemplary embodiment, the method further includes hydrogenation treating a crystallized portion of the first semiconductor and the exposed portion of the second semiconductor after irradiating the laser on the exposed portion of the first semiconductor.

According to an exemplary embodiment, the method further includes, forming an insulating layer on the first and second input electrodes and the first and second output electrodes after the hydrogenation treating, forming first and second conductors respectively connected to the first and second output electrodes on the insulating layer, and annealing under an inert gas atmosphere after forming the insulating layer or forming the conductor.

According to an exemplary embodiment, the first thin film transistor includes a first control electrode, a first semiconductor, a first ohmic contact layer, a first input electrode, and a first output electrode, the second thin film transistor includes a second control electrode, a second semiconductor, a second ohmic contact layer, a second input electrode, and a second output electrode, the first thin film transistor is disposed in a driving unit, and the second thin film transistor is disposed in a display unit.

According to an exemplary embodiment, the method further includes forming a first electrode connected to the first output electrode, forming an organic emission layer on the first electrode, and forming a second electrode on the organic emission layer.

In another exemplary embodiment, the present invention provides a manufacturing method of a display device. The method includes forming first and second control electrodes, sequentially depositing a gate insulating layer, a semiconductor layer, and an ohmic contact layer on the first and second control electrodes, etching the semiconductor layer and the ohmic contact layer to form a first semiconductor and a first ohmic contact layer disposed on the first control electrode and to form a second semiconductor and a second ohmic contact layer disposed on the second control electrode, removing a portion of the first and second ohmic contact layers to expose a portion of the first and second semiconductors, irradiating a laser on the exposed portion of the first semiconductor, and forming a pair of a first input electrode and a first output electrode disposed on the first ohmic contact layer and a pair of a second input electrode and a second output electrode disposed on the second ohmic contact layer.

According to an exemplary embodiment, the etching of the semiconductor layer and the ohmic contact layer and the removing of the portion of the first and second ohmic contact layers is executed by using a mask including a transmitting region, a semi-transmitting region, and a shielding region, and a first portion where the first and second semiconductors and the first and second ohmic contact layers are removed and the gate insulating layer is exposed, a second portion where the first and second ohmic contact layers are removed and the first and second semiconductors are exposed, and a third portion where the first and second ohmic contact layers and the first and second semiconductors remain, is formed by using the mask.

According to an exemplary embodiment, the method further includes hydrogenation treating the crystallized portion of the first semiconductor and the exposed portion of the second semiconductor after crystallizing the exposed portion of the first semiconductor.

According to an exemplary embodiment, the method further includes forming an insulating layer on the first and second input electrodes and the first and second output electrodes, forming first and second conductors respectively connected to the first and second output electrodes on the insulating layer, and annealing under an inert gas atmosphere after forming the insulating layer or forming the first and second conductors after the hydrogenation treating.

According to an exemplary embodiment, the first thin film transistor includes a first control electrode, a first semiconductor, a first ohmic contact layer, a first input electrode, and a first output electrode, the second thin film transistor includes a second control electrode, a second semiconductor, a second ohmic contact layer, a second input electrode, and a second output electrode, the first thin film transistor is disposed in a driving unit, and the second thin film transistor is disposed in a display unit.

According to an exemplary embodiment, the method further includes forming a first electrode connected to the first output electrode, forming an organic emission layer on the first electrode, and forming a second electrode on the organic emission layer.

According to an exemplary embodiment of the present invention, a plurality of thin film transistors which are required to have different characteristics are formed on one substrate through the same manufacturing method and apparatus.

BRIEF DESCRIPTION OF THE DRAWINGS

The above and/or other aspects, features, and advantages of the present invention will become more apparent from the following detailed description when taken in conjunction with the accompanying drawings, in which.

DETAILED DESCRIPTION OF THE INVENTION

Figure 1:
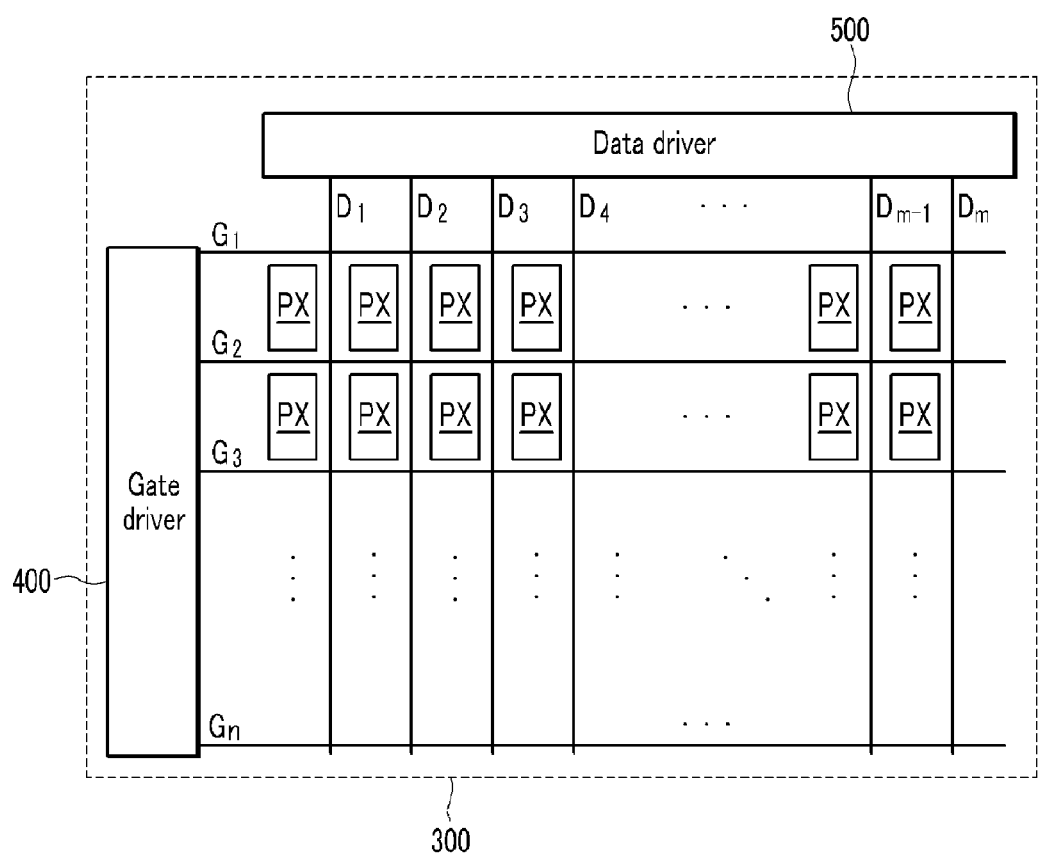
FIG. 1 is a schematic diagram of an exemplary embodiment of a display device according to the present invention.

The invention is described more fully hereinafter with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

A display device according to an exemplary embodiment of the present invention will be described with the reference to FIG. 1.

FIG. 1 is a schematic diagram of an exemplary embodiment of a display device according to the present invention.

Referring to FIG. 1, a display device according to an exemplary embodiment of the present invention includes a display panel unit 300 made of one or two display panels.

The display panel unit 300 includes a plurality of pixels PX, a plurality of gate lines $G_1$-$G_n$, a plurality of data lines $D_1$-$D_m$, a gate driver 400, and a data driver 500.

The gate lines $G_1$-$G_n$ transmit gate signals, and the data lines $D_1$-$D_m$ transmit data signals while crossing the gate lines $G_1$-$G_n$.

The pixels PX are connected to the gate lines $G_1$-$G_n$ and the data lines $D_1$-$D_m$ respectively and are arranged approximately in a matrix form. Each pixel PX includes a switching element (not shown) made of a TFT.

The gate driver 400 is connected to the gate lines $G_1$-$G_n$ of the display panel unit 300, and applies gate signals which are formed of a combination of a gate-on voltage Von and a gate-off voltage Voff to the gate lines $G_1$-$G_n$.

The data driver 500 is connected to the data lines $D_1$-$D_m$ of the display panel unit 300 and applies data signals to the data lines $D_1$-$D_m$.

The gate driver 400 and the data driver 500 include a plurality of TFTs (not shown) which generate and control the signals.

Next, a liquid crystal display according to an exemplary embodiment of the present invention will be described in detail with reference to FIG. 2.

Figure 2:
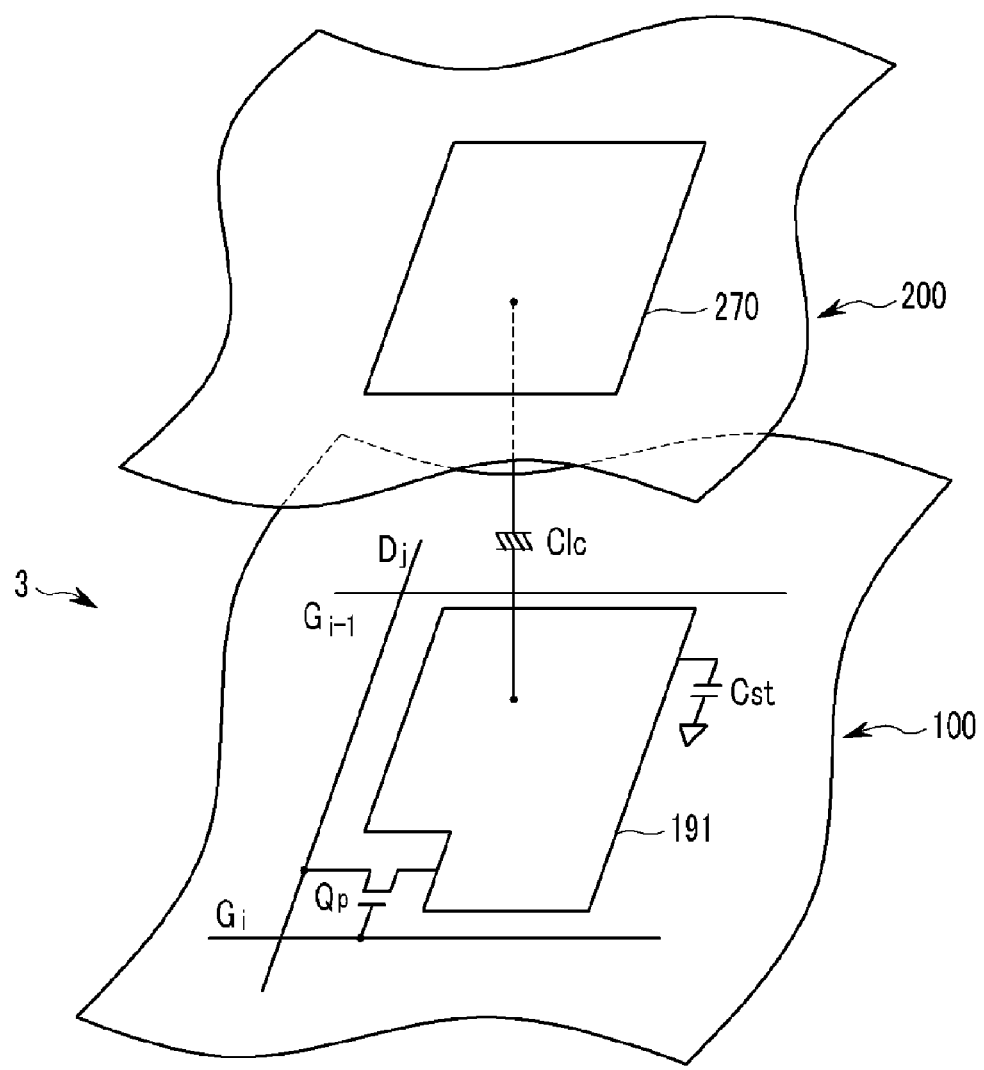
FIG. 2 is an equivalent circuit diagram of an exemplary embodiment of one pixel in a liquid crystal display according to the present invention.

FIG. 2 is an equivalent circuit diagram of an exemplary embodiment of one pixel of a liquid crystal display according to the present invention.

The display panel unit 300 of the liquid crystal display according to the current exemplary embodiment includes a lower panel 100 and an upper panel 200 facing each other, and a liquid crystal layer 3 formed therebetween.

Each pixel PX includes a thin film transistor Qp as a switching element connected to the gate line $G_i$ and the data line $D_j$, and a liquid crystal capacitor Clc and a storage capacitor Cst connected thereto. According to an exemplary embodiment, the storage capacitor Cst may be omitted, if necessary.

According to an exemplary embodiment, the switching thin film transistor Qp is a three terminal element which is provided in the lower panel 100, and includes a control terminal connected to the gate line $G_i$, an input terminal connected to the data line $D_j$, and an output terminal connected to the liquid crystal capacitor Clc and the storage capacitor Cst.

The structure of an exemplary embodiment of the thin film transistors (TFTs) of a pixel unit and a driving unit in the display device according to the present invention will be described with reference to FIG. 3.

Figure 3:
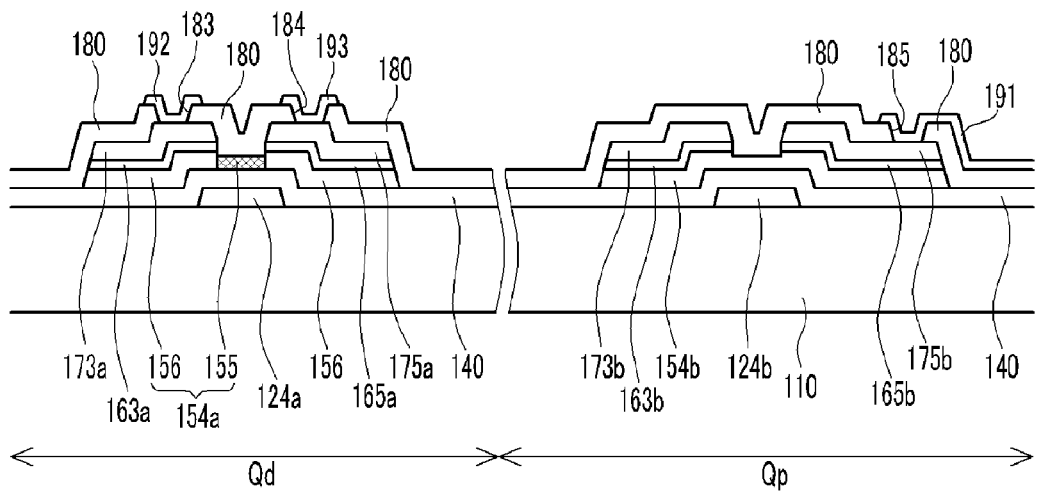
FIG. 3 shows cross-sectional views of an exemplary embodiment of structures of thin film transistors Qd and Qp respectively formed in a driver unit and a display unit of the display device according to the present invention.

FIG. 3 is cross-sectional views showing an exemplary embodiment of the structures of thin film transistors Qd and Qp respectively formed in a driver unit and a display unit of the display device according to the present invention.

Hereafter, for the purpose of illustration, the thin film transistor Qd of the driving unit is referred to as "circuit" and the thin film transistor Qp of the pixel unit referred to as "display".

A circuit control electrode 124a and a display control electrode 124b are formed on an insulating substrate 110. The display control electrode 124b is connected to a gate line (not shown).

A gate insulating layer 140 made of silicon nitride or silicon oxide is formed on the circuit control electrode 124a and the display control electrode 124b.

A circuit semiconductor 154a and a display semiconductor 154b are formed on the gate insulating layer 140.

The circuit semiconductor 154a overlaps the circuit control electrode 124a, and includes a first portion 155 made of polycrystalline semiconductor and a second portion 156 made of hydrogenated amorphous semiconductor or microcrystalline semiconductor. According to an exemplary embodiment, the polycrystalline semiconductor of the first portion 155 is formed by crystallizing amorphous semiconductor by irradiating a laser thereto. Irradiating a laser may be executed using an excimer laser, $CO_2$, ND-YAG laser, Ti-Sapphire laser. The semiconductor may be made of silicon (Si), germanium(Ge), gallium arsenide(GaAs)), selenium (Se), zinc oxide(ZnO), zinc selenide(ZnSe), cadmium selenide(CdSe), cadmium sulfide(CdS) and so on.

The display semiconductor 154b overlaps the display control electrode 124b, and is made of hydrogenated amorphous silicon.

A circuit input electrode 173a, a circuit output electrode 175a, a display input electrode 173b, and a display output electrode 175b are formed on the circuit semiconductor 154a, the display semiconductor 154b, and the gate insulating layer 140.

The circuit input electrode 173a and the circuit output electrode 175a are disposed on the circuit semiconductor 154a and are separated from each other by a predetermined interval.

The second portion 156 of the circuit semiconductor 154a is overlapped by the circuit input electrode 173a and the circuit output electrode 175a, and the first portion 155 of the circuit semiconductor 154a does not overlapped the circuit input electrode 173a and the circuit output electrode 175a and is exposed. The first portion 155 of the circuit semiconductor 154a is particularly disposed between the circuit input electrode 173a and the circuit output electrode 175a, and the width thereof is substantially the same as the interval between the circuit input electrode 173a and the circuit output electrode 175a.

According to an exemplary embodiment, the display input electrode 173b and the display output electrode 175b are disposed on the display semiconductor 154b and face each other with a predetermined interval therebetween, and a portion of the display semiconductor 154b is exposed through the interval.

In the current exemplary embodiment, the first portion 155 of the circuit semiconductor 154a is thinner than the second portion 156 of the circuit semiconductor 154a, and the exposed portion of the display semiconductor 154b is also be thinner than the un-exposed portion of the display semiconductor 154b. According to an exemplary embodiment, the thickness of the thin portion of the semiconductor 154a and 154b is in a range of approximately 300 to approximately 1500 Å. When the thickness is less than approximately 300 Å, the formation of the channel of the thin film transistor may be not completed, and when it is more than approximately 1500 Å, the laser beam does not penetrate to the lower portion of the circuit semiconductor 154a when irradiating the laser to crystallize, such that the melting of the silicon and the re-crystallization are not effectively realized and the crystallization of the circuit semiconductor 154a may be not completed to thereby deteriorate the characteristics of the thin film transistor.

Ohmic contacts 163a, 165a, 163b, and 165b are formed between the circuit input electrode 173a and the circuit semiconductor 154a, the circuit output electrode 175a and the circuit semiconductor 154a, the display input electrode 173b and the display semiconductor 154b, and the display output electrode 175b and the display semiconductor 154b, respectively. The ohmic contacts 163a, 165a, 163b, and 165b are made of n+ hydrogenated amorphous silicon or n+ crystallized silicon doped with an impurity such as phosphorous at a high concentration, or of silicide.

According to an exemplary embodiment, the ohmic contacts 163a, 165a, 163b, and 165b have a same planer shape as the data line including the display input electrode 173b, the display output electrode 175b, the circuit input electrode 173a, and the circuit output electrode 175a.

According to an exemplary embodiment, the circuit semiconductor 154a has the same planer shape as the circuit input electrode 173a and the circuit output electrode 175a except for the portion between the circuit input electrode 173a and the circuit output electrode 175a, and the display semiconductor 154b have the same planer shape as the display input electrode 173b and the display output electrode 175b except for between the display input electrode 173b and the display output electrode 175b.

A passivation layer 180 is formed on the circuit input electrode 173a, the circuit output electrode 175a, the display input electrode 173b, and the display output electrode 175b.

The passivation layer 180 includes a plurality of contact holes 183, 184, and 185 respectively exposing the circuit input electrode 173a, the circuit output electrode 175a, and the display output electrode 175b.

Conductors 192 and 193 are respectively connected to the circuit input electrode 173a and circuit output electrode 175a through the contact holes 183 and 184, and a pixel electrode 191 connected to the display output electrode 175b through the contact hole 185, are formed on the passivation layer 180.

In the current exemplary embodiment of the present invention,, the circuit control electrode 124a, the circuit input electrode 173a, and the circuit output electrode 175a form the driving thin film transistor Qd along with the circuit semiconductor 154a.

The display control electrode 124b, the display input electrode 173b, and the display output electrode 175b form the switching thin film transistor Qp of the display unit along with the display semiconductor 154b.

According to an exemplary embodiment, the channel of the driving thin film transistor Qd is formed in the polysilicon and the channel of the thin film transistor Qp of the display unit is formed in the amorphous silicon, such that the channel of the thin film transistor Qd of the driving unit and the channel of the thin film transistor Qp of the display unit are formed in semiconductors having different crystallization.

The channel of the driving thin film transistor Qd is formed in the polysilicon such that high carrier mobility and stability may be obtained. Also, although a gate bias and thermal stress are generated by the application of the repeated positive voltage under driving, degradation of the transistor is small such that a threshold voltage Vth is uniformly maintained to thereby prevent image sticking and a reduction of the lifetime thereof On the other hand, according to an exemplary embodiment, the second portion 156 made of amorphous semiconductor or microcrystalline semiconductor is formed on both sides of the first portion 155 of the circuit semiconductor 154a, and the regions where the circuit input electrode 173a and the circuit control electrode 124a overlap each other and the circuit output electrode 175a and the circuit control electrode 124a overlap each other among the second portions 156 have functions such as of an offset or a low concentration doped drain (lightly doped drain, "LDD"). This reduces the electric field generated at the circumference of the circuit output electrode 175 a when charges move from the circuit input electrode 173a to the circuit output electrode 175a, to thereby prevent the degradation of the thin film transistor by hot carrier stress. In the current exemplary embodiment, the length of the overlapping regions of the circuit input electrode 173a and the circuit control electrode 124a, or the circuit output electrode 175a and the circuit control electrode 124a, is less than approximately 8 μm. In this way, the channel of the driving thin film transistor Qd is formed in the polysilicon, to thereby improve the carrier mobility and the stability, and the portions made of amorphous silicon are disposed on both sides of the channel to thereby reduce leakage current.

The characteristics of the thin film transistor including these structures according to an exemplary embodiment of the present invention will be described with the reference to FIG. 23 to FIG. 24B, and Table 1.

Figure 23:
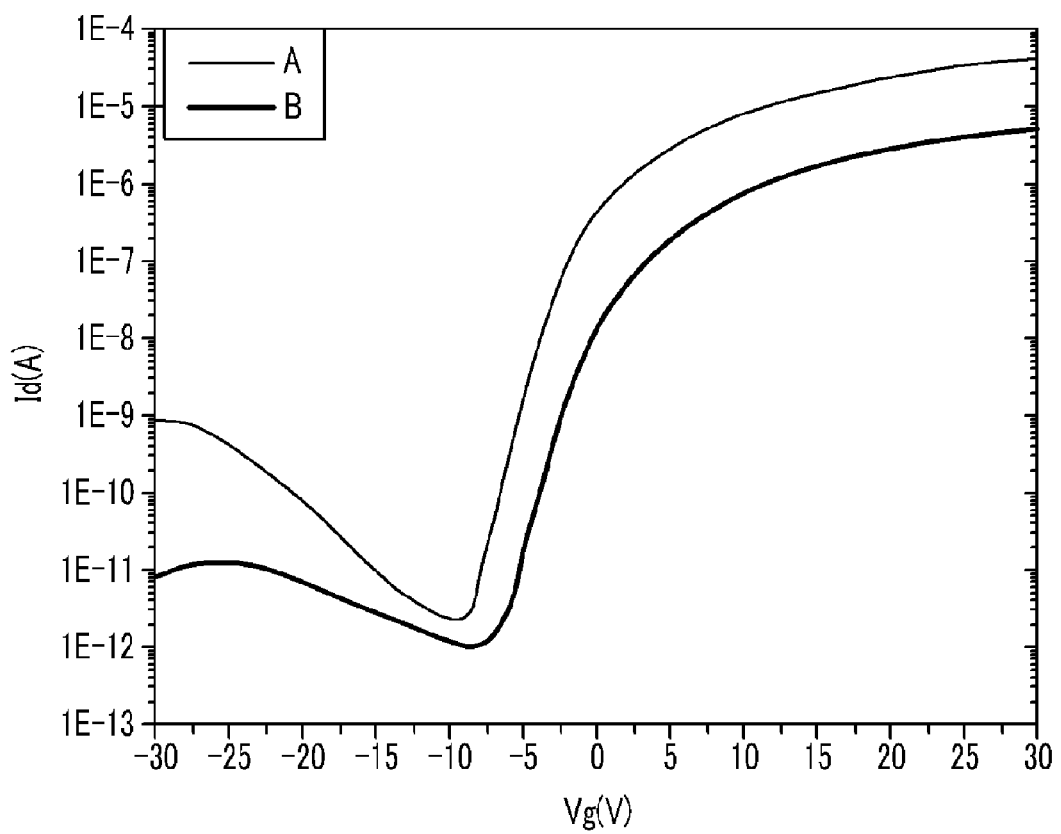
FIG. 23 is a graph showing an exemplary embodiment of a current characteristic of a thin film transistor Qd of a driving unit according to the present invention and a thin film transistor according a comparative example, respectively applied with voltages.
Figure 24A:
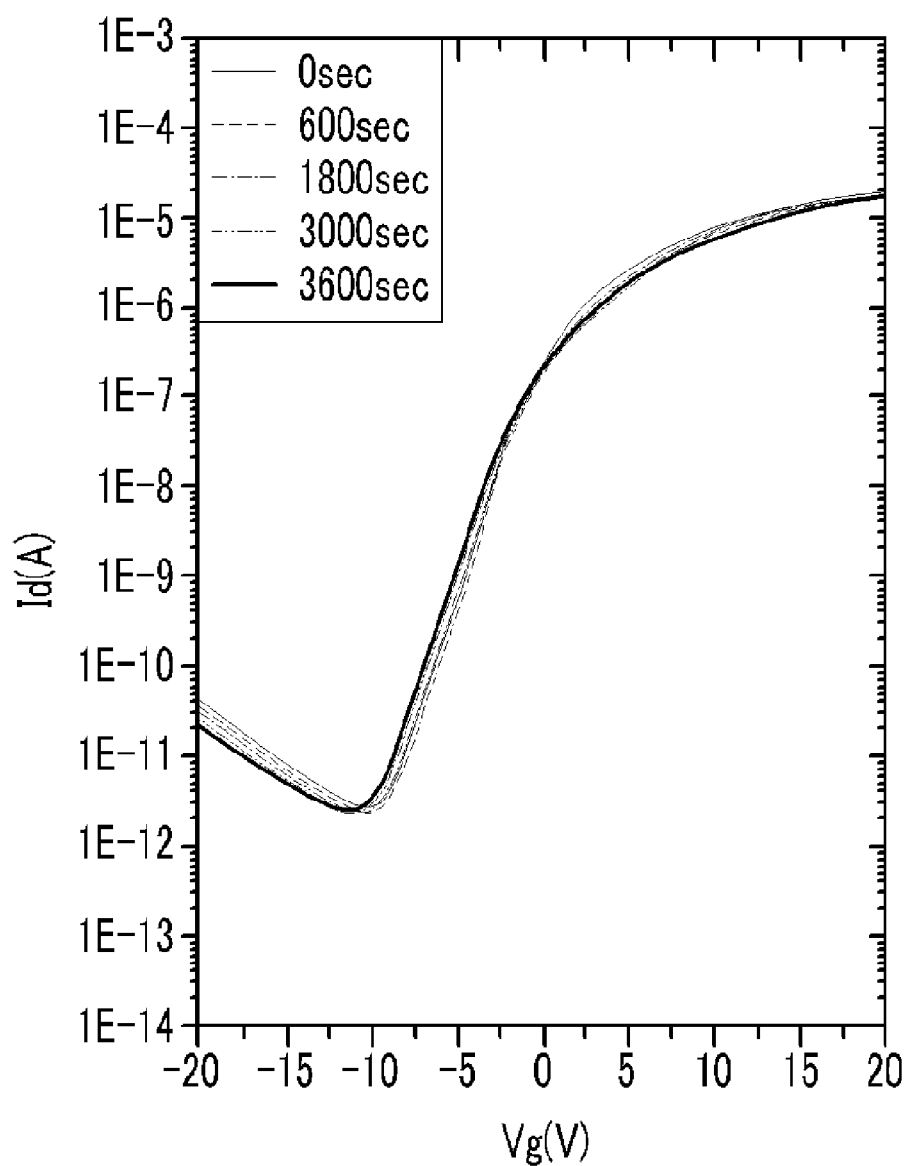
FIG. 24A and FIG. 24B are graphs showing an exemplary embodiment of bias-thermal stress of a thin film transistor Qd of a driver unit according to the present invention and a thin film transistor according a comparative example, respectively supplied with a bias and thermal stress during a predetermined time.
Figure 24B:
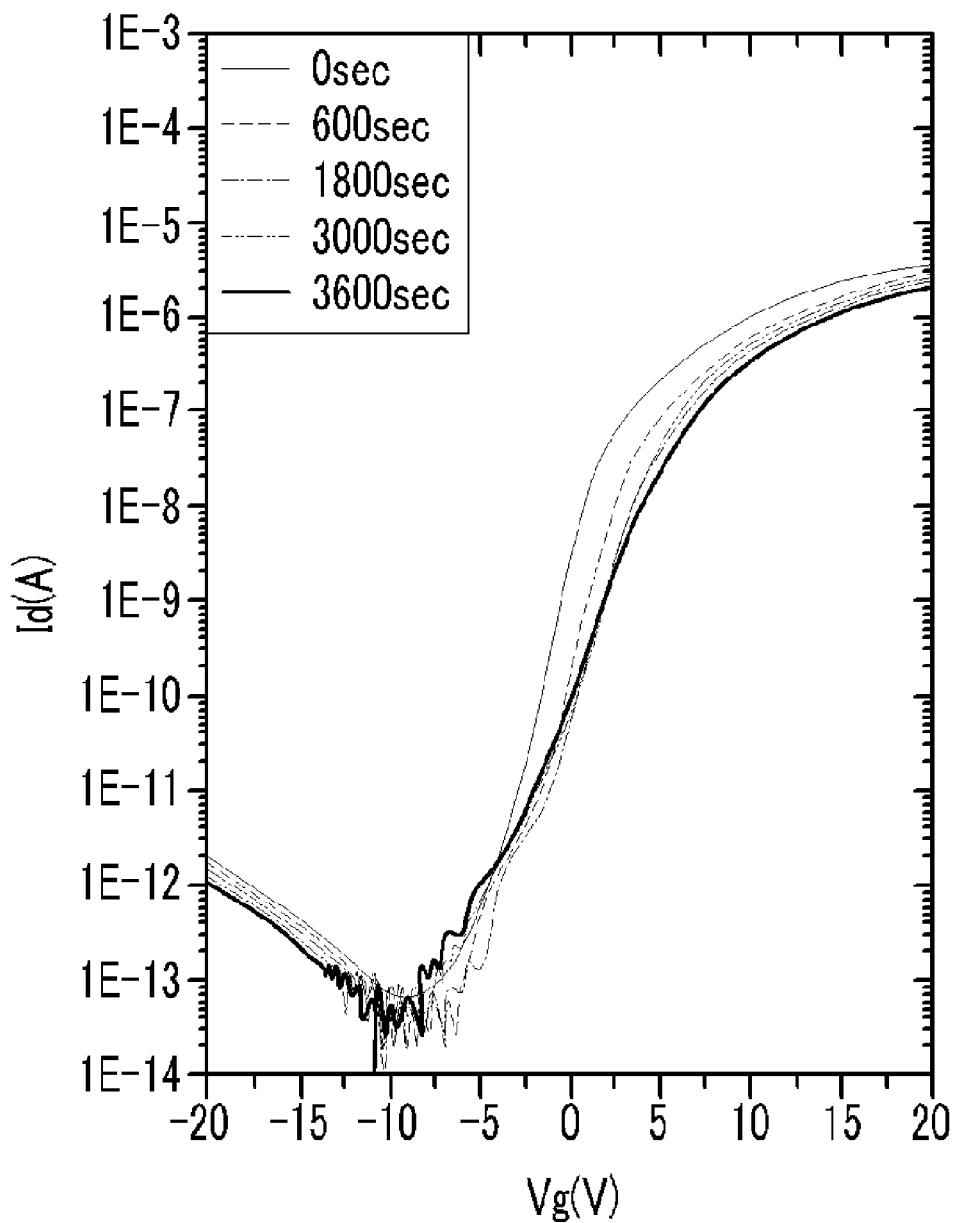

FIG. 23 is a graph showing an exemplary embodiment of a current characteristic of a thin film transistor Qd of a driving unit according to the present invention and a thin film transistor according to a comparative example, respectively applied with voltages, and FIG. 24A and FIG. 24B are graphs showing an exemplary embodiment of a bias-thermal stress of a thin film transistor Qd of a driver unit according the present invention and a thin film transistor according a comparative example, respectively supplied with a bias and thermal stress for a predetermined time. In the current exemplary embodiment, the comparative example is a thin film transistor of a bottom gate type in which the channel is formed in amorphous silicon.

Referring to FIG. 23 and Table 1, "A" is a case in which the voltage is applied to the thin film transistor Qd of the driving unit according to an exemplary embodiment of the present invention, and "B" is a case in which the voltage is applied to the thin film transistor according to a comparative example.

TABLE 1

|  | A | B |
|---|---|---|
| Carrier Mobility (cm$^2$/V · s) | 2.5 | 0.36 |
| Threshold voltage (Vth, V) | −2.57 | −0.05 |
| Ioff/Ion (ΔV = 27) | 9.32 × 10$^6$ | 2.43 × 10$^6$ |

As shown in FIG. 23 and Table 1, a thin film transistor according to an exemplary embodiment of the present invention includes a high current ratio carrier mobility and a low threshold voltage compared with the comparative example.

Referring to FIG. 24A, a bias-thermal stress is supplied to the thin film transistor Qd according to an exemplary embodiment of the present invention for a determined time and the change of the amount of current was measured. As a result, minimal change of the current characteristic was generated after the passing of time of 0 seconds, 600 seconds, 1800 seconds, 3000 seconds, and 3600 seconds.

Referring to FIG. 24B, a bias-thermal stress is supplied to the thin film transistor according to the comparative example for a determined time and the change of the amount of the current was measured. As a result, the current characteristic decreased according to the passing of time.

According to these results, the semiconductor is degraded in a short time due to the bias and the thermal stress in the case of the comparative example, while the thin film transistor according to an exemplary embodiment of the present invention is not degraded by the bias and the thermal stress.

In an exemplary embodiment of the present invention, these driving thin film transistors are adapted such that the gate driver and the data driver are directly integrated on the substrate to thereby reduce the manufacturing cost of the display device.

On the other hand, the channel of the thin film transistor Qp in the display unit is formed in the amorphous silicon such that the $I_{on}/I_{off}$ ratio of on/off current is increased and the leakage current may be reduced. Accordingly, a reduction of the data voltage may be prevented and cross-talk may be reduced.

In the present exemplary embodiment, one driving thin film transistor Qd and one display thin film transistor Qp are shown for convenience of explanation. However, the present invention is not limited hereto, and may further include at least one thin film transistor.

Now, a manufacturing method of the display device shown in FIG. 3 will be described in detail with reference to FIG. 4 to FIG. 11.

FIG. 4 to FIG. 11 are cross-sectional views sequentially showing the method of manufacturing the display device shown in FIG. 3 according to an exemplary embodiment of the present invention.

Figure 4:
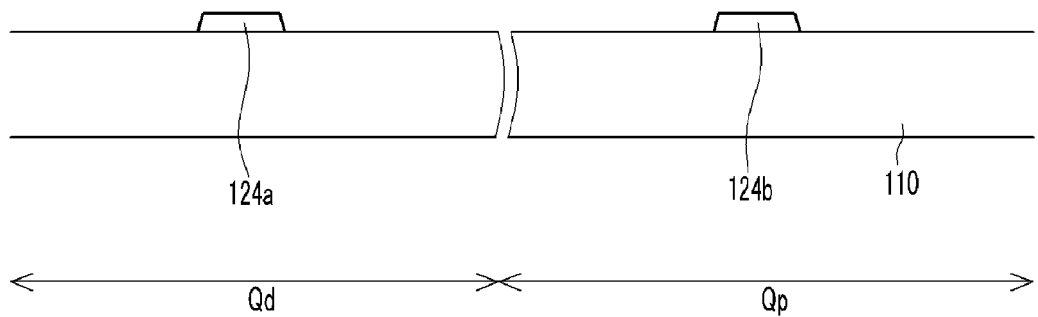
FIG. 4 through FIG. 11 are cross-sectional views sequentially showing an exemplary embodiment of a manufacturing method of the display device shown in FIG. 3 according to the present invention.

Referring to FIG. 4, a gate line (not shown) including a display control electrode 124b and a circuit control electrode 124a are formed on an insulating substrate 110.

Figure 5:
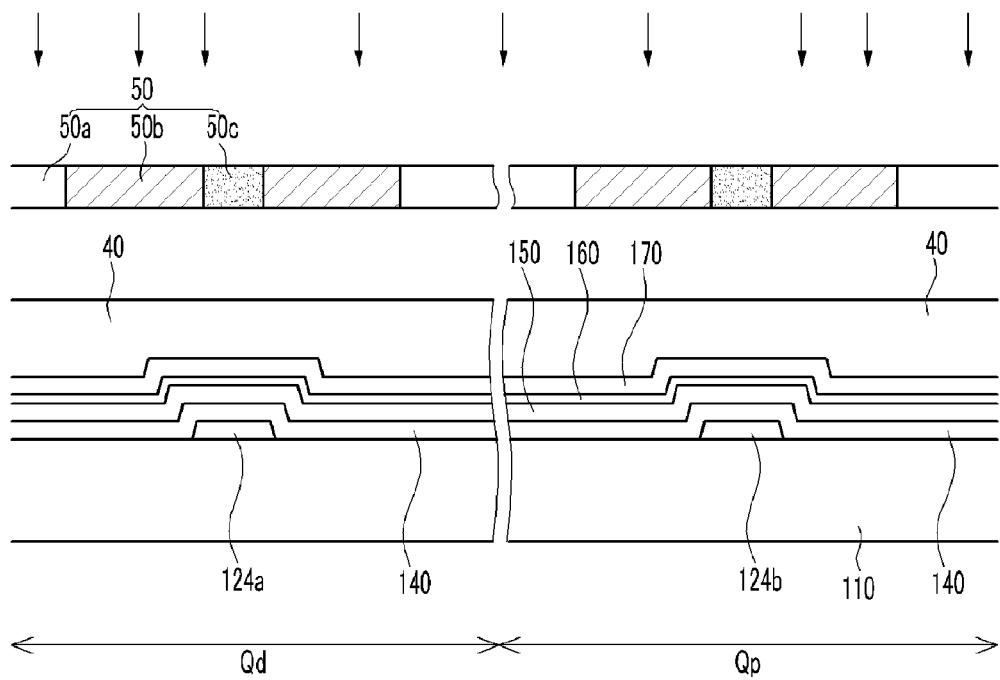

Referring to FIG. 5, a gate insulating layer 140, a semiconductor layer 150, an ohmic contact layer 160, and a conductive layer 170 are sequentially deposited on the circuit control electrode 124a and the display control electrode 124b, and a photosensitive film 40 is coated thereon In addition, a mask 50 is aligned on the photosensitive film 40 and the photosensitive film 40 is exposed by the light. According to the current exemplary embodiment, the mask 50 includes a semi-transmissive region 50c as well as a transmissive region 50a and a shielding region 50b. According to an exemplary embodiment, the semi-transmissive region 50c includes a slit pattern or a lattice pattern, or is a thin film having a middle transmittance or a middle thickness. When using the slit pattern, the width of the slit and the interval between the slits is less than the resolution of a light exposer used in the photo process.

Figure 6:
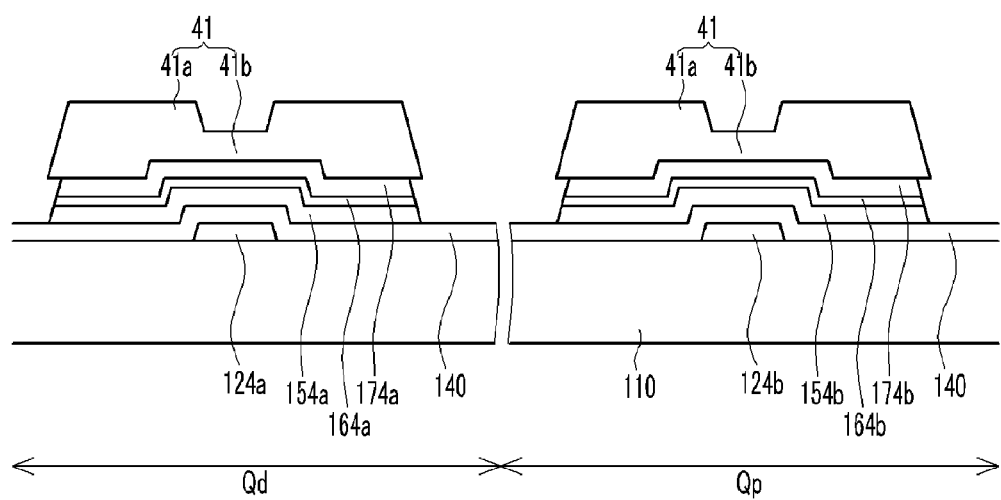

As shown in FIG. 6, the mask 50 is removed and the exposed photosensitive film 40 is developed to form a photoresist pattern 41 which includes a first photoresist pattern 41a and a second photoresist pattern 41b having a thinner thickness than the first photoresist pattern 41a. The first photoresist pattern 41a is disposed on the portion where a data line including a display input electrode 173b, a display output electrode 175b, a circuit input electrode 173a, and a circuit output electrode 175a is formed, and the second photoresist pattern 41b is disposed between the portions where a display input electrode 173b and the display output electrode 175b will be formed and a circuit input electrode 173a and a circuit output electrode 175a is formed.

According to an exemplary embodiment, the ratio between the thicknesses of first photoresist pattern 41a and the second photoresist pattern 41b changes according to the process conditions, however, the thickness of the second photoresist pattern 41b is less than half the thickness of the first photoresist pattern 41a.

Next, the conductive layer 170, the ohmic contact layer 160, and the semiconductor layer 150 are sequentially etched by using the first and second photoresist patterns 41a and 41b as an etch mask to form a plurality of conductive patterns 174a and 174b, a plurality of ohmic contact patterns 164a and 164b, a circuit semiconductor 154a, and a display semiconductor 154b.

Figure 7:
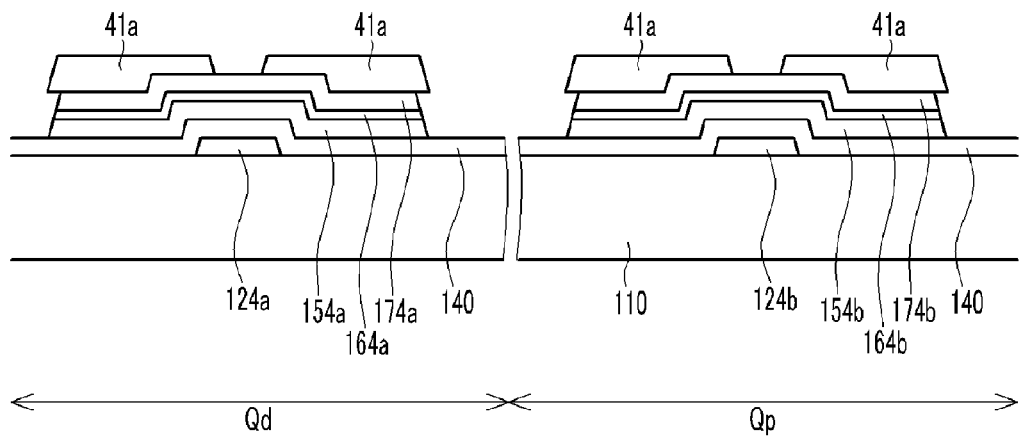

Next, referring to FIG. 7, an etch-back process such as ashing is executed to remove the second photoresist pattern 41b. Further, the thickness of the first photoresist pattern 41a is reduced.

Figure 8:
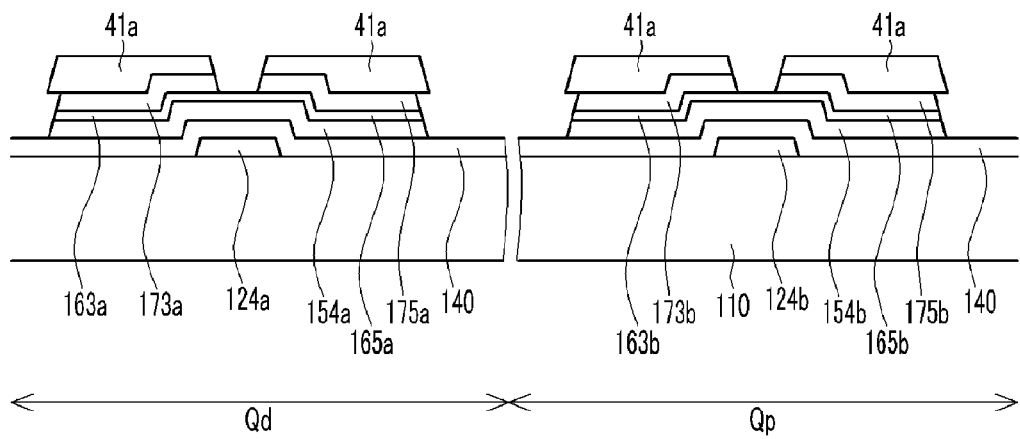

Next, referring to FIG. 8, the conductive patterns 1 74a and 1 74b are etched by using the first photoresist pattern 41a as an etch mask to form a circuit input electrode 173a, a circuit output electrode 175a, a display input electrode 173b and display output electrode 175b, and the ohmic contact pattern 164a disposed between the circuit input electrode 173a and the circuit output electrode 175a and the ohmic contact pattern 164b disposed between the display input electrode 173b and the display output electrode 175b are exposed.

Next, the exposed portions of the ohmic contact patterns 164a and 164b are dry-etched to respectively expose the circuit semiconductor 154a and the display semiconductor 154b disposed thereunder. According to the current exemplary embodiment, the portions of the circuit semiconductor 154a and the display semiconductor 154b disposed under the ohmic contact patterns 164a and 164b are etched such that a thickness of the exposed portions of the circuit semiconductor 154a and the display semiconductor 154b is decreased. This is referred to as a back channel etch ("BCE").

Next, a dehydrogenation operation is performed. The dehydrogenation operation is formed in a furnace or an oven at a temperature of about 300 to 450° C., at approximately 350° C. In the dehydrogenation operation, the hydrogen that is previously combined with the amorphous silicon of the exposed circuit semiconductor 154a and display semiconductor 154b is removed such that excessive generation of outgassing under crystallizing is reduced, thereby protecting the surfaces of the circuit semiconductor 154a and the display semiconductor 154b. According to an exemplary embodiment, the dehydrogenation operation is further performed in-situ in the equipment after depositing the gate insulating layer 140, the semiconductor layer 150, and the ohmic contact layer 160 in the plasma enhanced chemical vapor deposition ("PECVD") equipment of the operation shown in FIG. 5 or in an additional annealing chamber as well as the performance of this operation.

Next, a laser is irradiated on the thin film transistor Qd of the driving unit to crystallize the exposed portion of the circuit semiconductor 154a. According to an exemplary embodiment, the laser is disposed on the substrate and the laser bean is irradiated on the driving unit by a scanning method such that the laser bean is not irradiated on the display unit. According to an exemplary embodiment, the laser is not limited to any particular type of laser, and may vary, as necessary. For example, an excimer laser or a diode pumped solid state laser ("DPSS") of a pulse type with a wavelength more than approximately 450 nm is used.

Figure 9A:
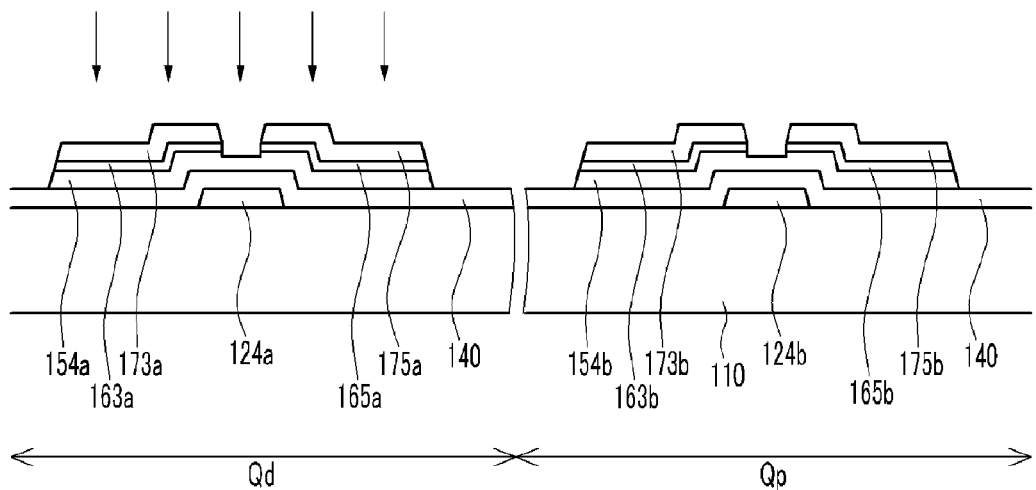
Figure 9B:
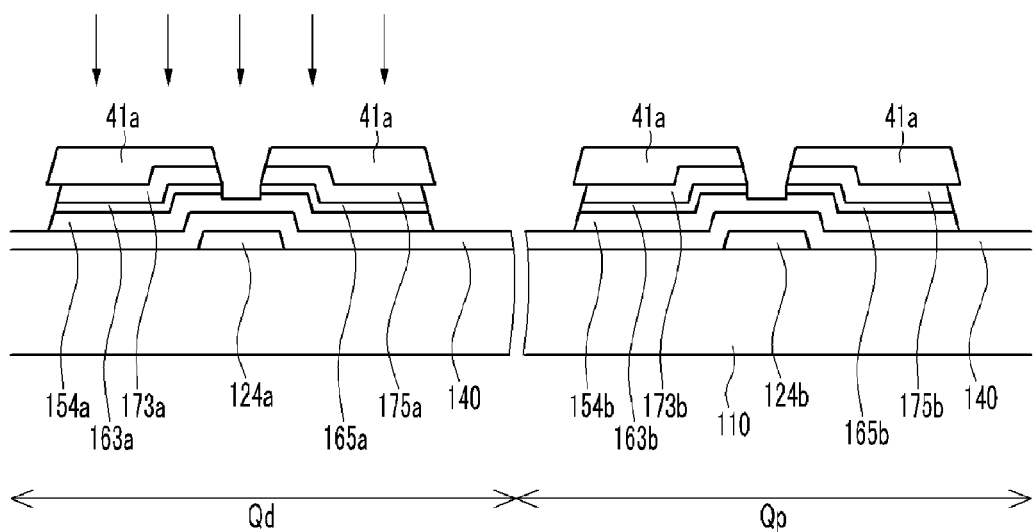
Figure 9C:
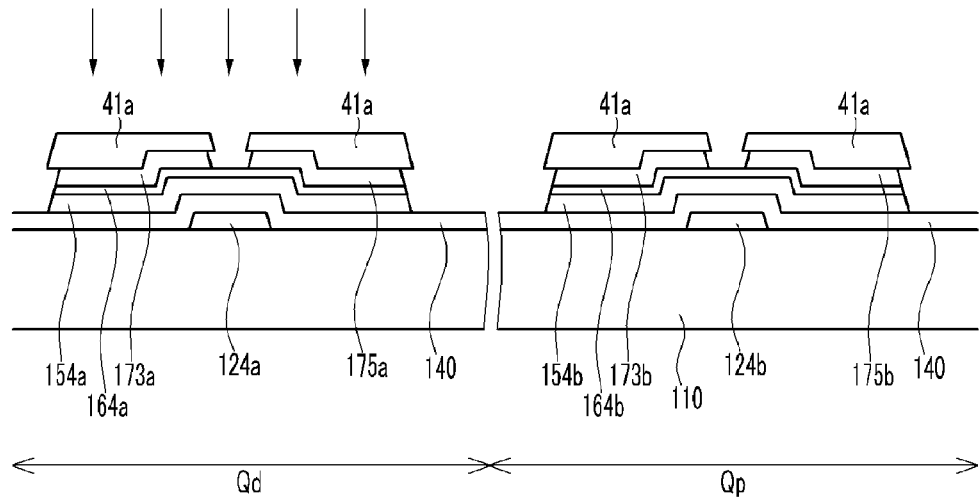

The crystallizing method is one of the methods shown in FIG. 9A to FIG. 9C.

As shown in FIG. 9A, the first photoresist pattern 41a is removed and the laser is irradiated to the exposed portion of the circuit semiconductor 154a by using the circuit input electrode 173a and the circuit output electrode 175a as a mask. The exposed portion between the circuit input electrode 173a and the circuit output electrode 175a among the circuit semiconductor 154a is crystallized, and the laser is blocked by the circuit input electrode 173a and the circuit output electrode 175a such that the portions disposed under the circuit input electrode 173a and the circuit output electrode 175a are not crystallized and remain in the amorphous state.

As shown in FIG. 9B, the first photoresist pattern 41a is not removed and the laser is irradiated to the exposed portion of the circuit semiconductor 154a by using the first photoresist pattern 41a, the circuit input electrode 173a, and circuit output electrode 175a as a mask. The exposed portion between the circuit input electrode 173a and the circuit output electrode 175a among the circuit semiconductor 154a is crystallized and because the laser is blocked by the first photoresist pattern 41a, the portions disposed under the circuit input electrode 173a and the circuit output electrode 175a are not crystallized.

Thus, when irradiating the laser while leaving the first photoresist pattern 41a, generation of charge accumulation and static electricity on the metal surface that may be generated by directly exposing the circuit input electrode 173a and the circuit output electrode 175a to the laser may be reduced. Also, the first photoresist pattern 41a absorbs heat that may be generated when irradiating the laser such that the circuit input electrode 173a and the circuit output electrode 175a surfaces are prevented from being damaged by the heat.

As shown in FIG. 9C, the laser is irradiated by using the first photoresist pattern 41a as a mask before etching the exposed portion of the ohmic contact patterns 164a. Thus, the exposed portion of the ohmic contact pattern 164a and the circuit semiconductor 154a thereunder are crystallized. After irradiating the laser, the exposed portion of the ohmic contact pattern 164a is dry-etched.

Figure 10:
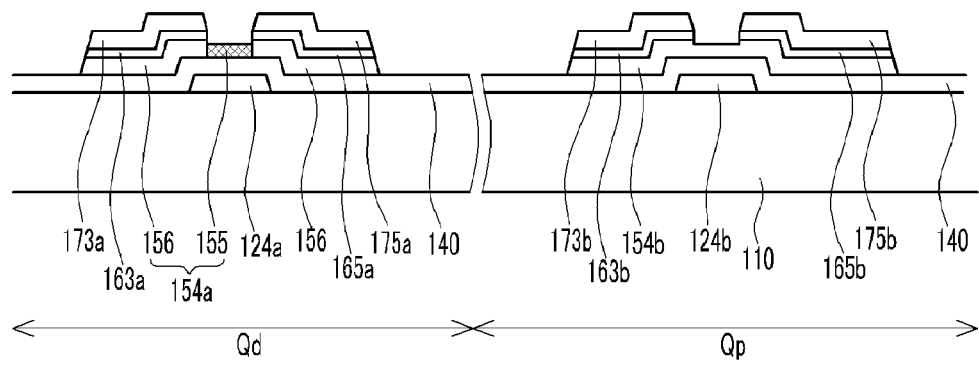

When irradiating the laser with one of the three methods as shown in FIGS. 9A, 9B, and 9C, as shown in FIG. 10, the circuit semiconductor 154a is divided into the first portion 155 of the polysilicon and the second portion 156 which is not crystallized and is made of the amorphous silicon.

When the thickness of the portion where the circuit semiconductor 154a will be crystallized is less than approximately 1500 Å, the laser effectively penetrates to the lower surface of the circuit semiconductor 154a such that the circuit semiconductor 154a has a uniform temperature distribution in the vertical direction. On the other hand, the circuit input electrode 173a and the circuit output electrode 175a have a lower temperature than the melted portion of the semiconductor in the horizontal direction such that the crystallization may be generated from a position nearing the circuit input electrode 173a and the circuit output electrode 175a, that is to say, both end portions of the channel. Accordingly, the grain of the polysilicon grows in the horizontal direction according to the channel direction such that a disturbance of charge movement due to a grain boundary may be reduced, thereby increasing the carrier mobility and reducing the leakage current.

Next, a hydrogen plasma treatment is executed on the whole surface of the substrate. The hydrogen plasma treatment reduces defects that exist on the exposed portion of the circuit semiconductor 154a and the display semiconductor 154b.

Figure 25:
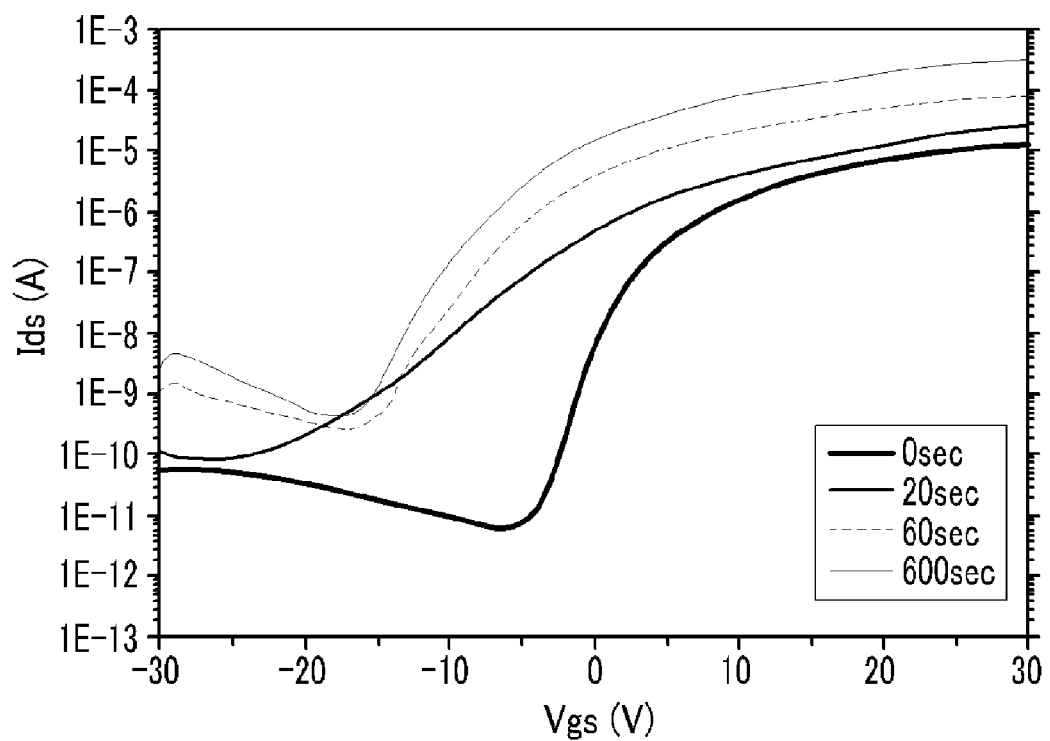
FIG. 25 is a graph showing an exemplary embodiment of the characteristics of the thin film transistor according the treatment time of hydrogen plasma, according to the present invention.

FIG. 25 is a graph showing an exemplary embodiment of the characteristics of the thin film transistor according the treatment time of hydrogen plasma, according to the present invention. As shown in FIG. 25, the amount of the current Ids is increased in the case of 0 seconds at which the hydrogen plasma treatment is not executed, and the cases of 20 seconds, 60 seconds, and 600 seconds at which the hydrogen plasma treatment is executed. Accordingly, defects are reduced in the channel of the circuit semiconductor 154a and the display semiconductor 154b by the hydrogen plasma treatment, since the movement of the charge is not disturbed.

Figure 11:
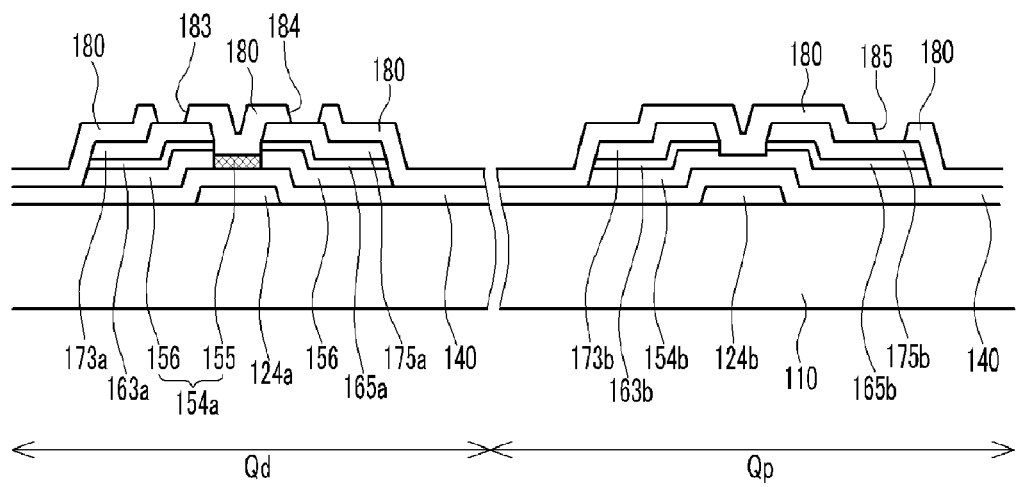

Referring to FIG. 11, a passivation layer 180 is formed on the entire the substrate 110 and patterned by photolithography to form a plurality of contact holes 183, 184, and 185 respectively exposing the circuit input electrode 173a, the circuit output electrode 175a, and the display output electrode 175b.

Referring to FIG. 3, a conductive layer is formed on the passivation layer 180 and patterned by photolithography to form conductors 192 and 193 that are connected to the circuit input electrode 173a and the circuit output electrode 175a through the contact holes 183 and 184 and a pixel electrode 191 that is connected to the display output electrode 175b through the contact hole 185.

Here, the substrate 110 may be annealed after forming the passivation layer 180 or forming the conductors 192 and 193 and the pixel electrode 191. The annealing is performed under an inert gas atmosphere at a temperature of approximately 300 degrees. The inert gas includes nitrogen, argon, helium and so on. In the annealing, the silicon of the circuit semiconductor 154a and the display semiconductor 154b is rearranged such that the defects that exist between the silicon combinations are reduced, thereby reducing the leakage current.

Figure 26:
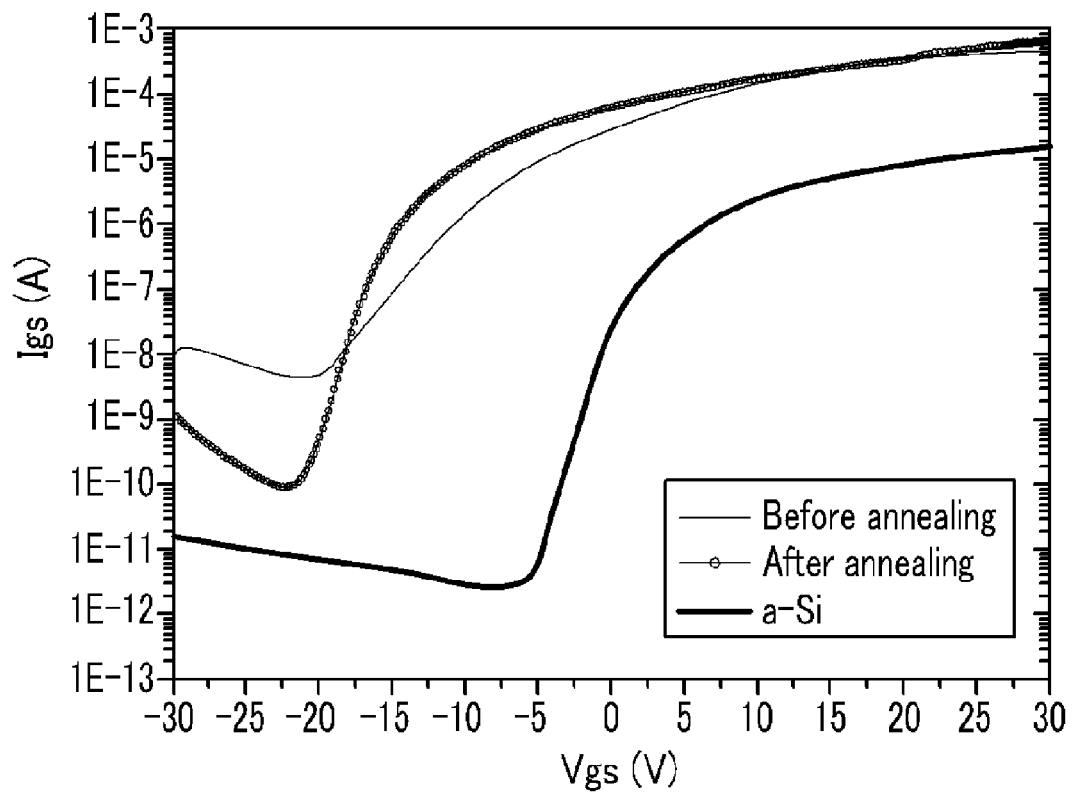
FIG. 26 is a graph showing an exemplary embodiment of the characteristics of the thin film transistor when annealing the display device according to the present invention.

FIG. 26 is a graph showing an exemplary embodiment of the characteristics of the thin film transistor when annealing the display device according to an exemplary embodiment of the present invention. As shown in FIG. 26, the leakage current is remarkably reduced after the annealing, compared with before the annealing. Also, when comparing with the case in which the channel is formed in the amorphous silicon (a-Si), the thin film transistor according to an exemplary embodiment of the present invention may have a characteristic of a high on-current.

According to an exemplary embodiment of the present invention, the driving thin film transistor and the display thin film transistor that are required to have different characteristics may be formed on one substrate through the same manufacturing method and apparatus. Accordingly, the gate driver and the data driver including the driving thin film transistor may be directly integrated on the substrate such that the manufacturing cost of the display device maybe reduced.

The thin film transistor of a bottom gate type was described in the present exemplary embodiment, but the present invention may be identically adapted to a thin film transistor of the different structure such as a top gate type, for example.

Also, the method using the four masks by forming the semiconductor layer and the data line with one mask was described in the present exemplary embodiment, but it is not limited thereto, and may vary according. That is, the present invention may be adapted to a method using five masks by forming the semiconductor layer and the data line with the separate mask or a method using three masks by forming the passivation layer and the pixel electrode with one mask.

Also, the present invention is not limited to any particular to of display and therefore may vary, as necessary. For example, the present invention may be used in a display device including a driving unit and a display unit such as an organic light emitting device and an electrophoretic display.

Next, another exemplary embodiment of the present invention will be described with reference to FIG. 12.

Figure 12:
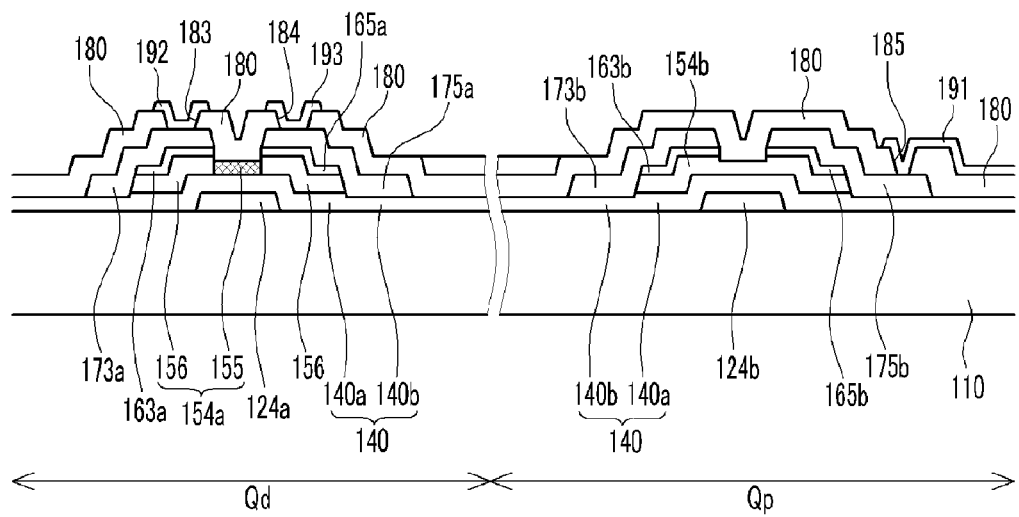
FIG. 12 shows cross-sectional views of another exemplary embodiment of structures of thin film transistors Qd and Qp respectively formed in a driver unit and a display unit of the display device according to the present invention.

FIG. 12 shows cross-sectional views of an exemplary embodiment of the structures of thin film transistors Qd and Qp respectively formed in a driver unit and a display unit of the display device according to another exemplary embodiment of the present invention. The same features are indicated by the same reference numerals as in previous exemplary embodiment mentioned above and therefore, a detailed description thereof is omitted.

A circuit control electrode 124a and a display control electrode 124b are formed on an insulating substrate 110. The display control electrode 124b is connected to a gate line (not shown).

A gate insulating layer 140 is formed on the circuit control electrode 124a and the display control electrode 124b, and the gate insulating layer 140 includes a fifth portion 140a and a sixth portion 140b.

The sixth portion 140b is thinner than the fifth portion 140a, and a circuit semiconductor 154a and a display semiconductor 154b are formed on the fifth portion 140a.

The circuit semiconductor 154a overlaps the circuit control electrode 124a, and includes a first portion 155 made of polysilicon and a second portion 156 made of hydrogenated amorphous silicon.

The display semiconductor 154b overlaps the display control electrode 124b, and is made of hydrogenated amorphous silicon.

A pair of ohmic contacts 163a and 165a are formed on the circuit semiconductor 154a, and a pair of ohmic contacts 163b and 165b are formed on the display semiconductor 154b.

A circuit input electrode 173a, a circuit output electrode 175a, a display input electrode 173b, and a display output electrode 175b are formed on the ohmic contacts 163a, 165a, 163b, and 165b, and on the gate insulating layer 140.

The circuit input electrode 173a and the circuit output electrode 175a face each other on the circuit semiconductor 154a with a predetermined interval therebetween, a first portion 155 of the circuit semiconductor 154a is exposed therebetween, the display input electrode 173b and the display output electrode 175b face each other on the display semiconductor 154b with a predetermined interval therebetween, and a portion of the display semiconductor 154b is exposed therebetween.

A passivation layer 180 having a plurality of contact holes 183, 184, and 185 is formed on the circuit input electrode 173a, the circuit output electrode 175a, the display input electrode 173b, and the display output electrode 175b.

Conductors 192 and 193 respectively connected to the circuit input electrode 173a and circuit output electrode 175a through the contact holes 183 and 184 and a pixel electrode 191 (see FIG. 2, for example) connected to the display output electrode 175b through the contact hole 185 are formed on the passivation layer 180.

Next, a manufacturing method of the display device shown in FIG. 12 will be described with reference to FIG. 13 to FIG. 19.

FIG. 13 through FIG. 19 are cross-sectional views sequentially showing an exemplary embodiment of a manufacturing method of the display device shown in FIG. 12 according to the present invention.

Figure 13:
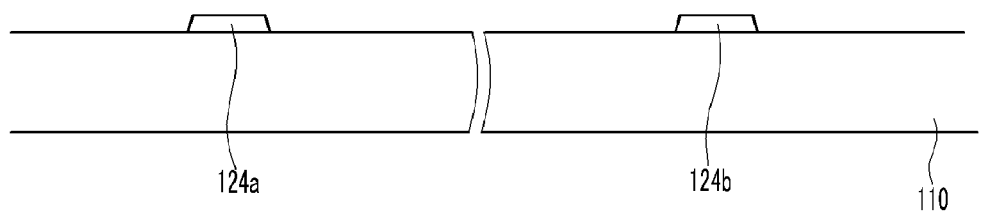
FIG. 13 through FIG. 19 are cross-sectional views sequentially showing an exemplary embodiment of a manufacturing method of the display device shown in FIG. 12 according to the present invention.

Referring to FIG. 13, a gate line (not shown) including a display control electrode 124b and a circuit control electrode 124a are formed on an insulating substrate 110.

Figure 14:
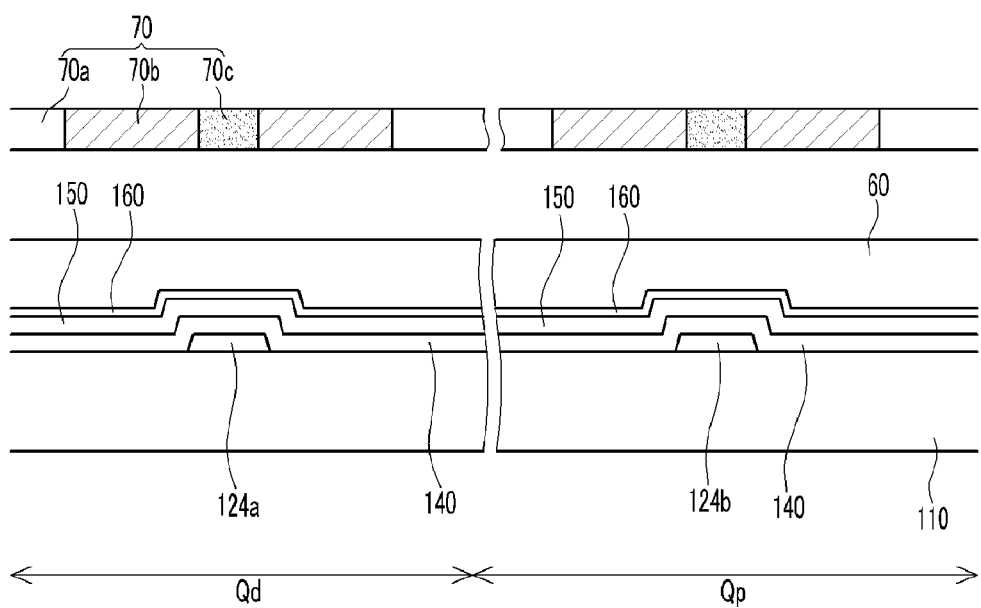

Next, referring to FIG. 14, a gate insulating layer 140, a semiconductor layer 150, and an ohmic contact layer 160 are sequentially deposited on the circuit control electrode 124a and the display control electrode 124b, and a photosensitive film 60 is coated thereon.

A mask 70 including a semi-transmissive region 70c as well as a transmissive region 70a and a shielding region 70b is aligned on the photosensitive film 60, and the photosensitive film 60 is exposed by light.

Figure 15:
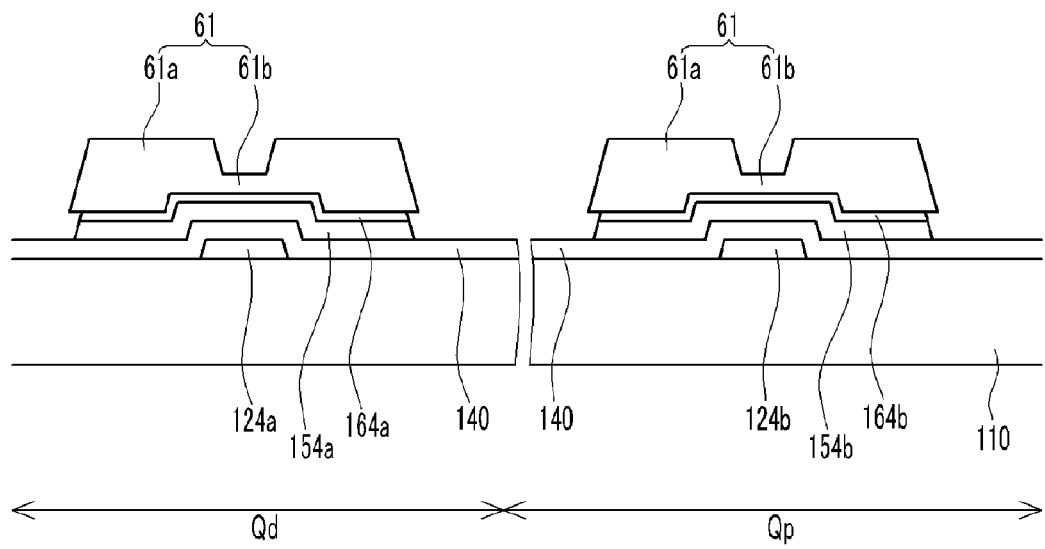

Next, referring to FIG. 15, the mask 70 is removed, and the exposed photosensitive film 60 is developed to form a photoresist pattern 61 which includes a first photoresist pattern 61a and a second photoresist pattern 61b having a thinner thickness than the first photoresist pattern 61a.

Next, the ohmic contact layer 160 and the semiconductor layer 150 are sequentially etched by using the first and second photoresist patterns 61a and 61b as an etching mask to form a plurality of ohmic contact patterns 164a and 164b, a circuit semiconductor 154a, and a display semiconductor 154b.

Figure 16:
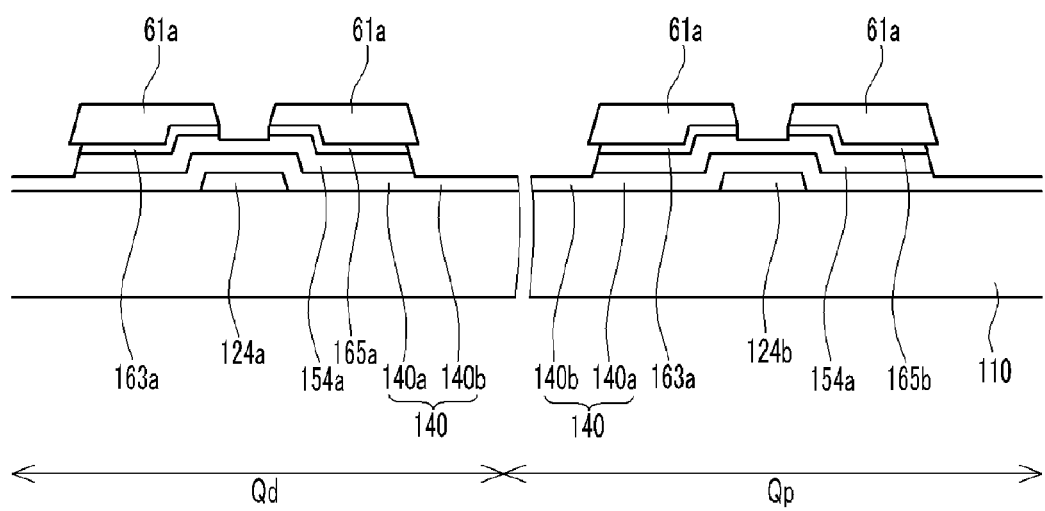

Next, referring to FIG. 16, an etch-back process such as ashing is performed to remove the second photoresist pattern 61b. In the current exemplary embodiment, the thickness of the first photoresist pattern 61a is reduced.

Next, back channel etch ("BCE") is executed by using the remaining first photoresist pattern 61a as a mask to remove the exposed portion of the ohmic contact patterns 164a and 164b and to expose the circuit semiconductor 154a and display semiconductor 154b disposed thereunder.

On the other hand, when performing the back channel etch, a condition in which the ohmic contact patterns 164a and 164b and a portion of the gate insulating layer 140 may be etched together exists, such that the thickness of the gate insulating layer 140 may be reduced. In the current exemplary embodiment, the portion covered by the circuit semiconductor 154a and the display semiconductor 154b among the gate insulating layer 140 is not etched and the remaining portion is etched such that the gate insulating layer 140b which is not covered by the circuit semiconductor 154a and the display semiconductor 154b becomes thinner than the gate insulating layer 140a disposed under the circuit semiconductor 154a and the display semiconductor 154b. In this way, the capacitance of the storage capacitor is increased by simultaneously reducing the thickness of the gate insulating layer 140 in the back channel etch step, and the thickness of the gate insulating layer disposed between the control electrode 124a and 124b and the semiconductor 154a and 154b is maintained such that the characteristic of the thin film transistor maybe maintained.

Figure 17:
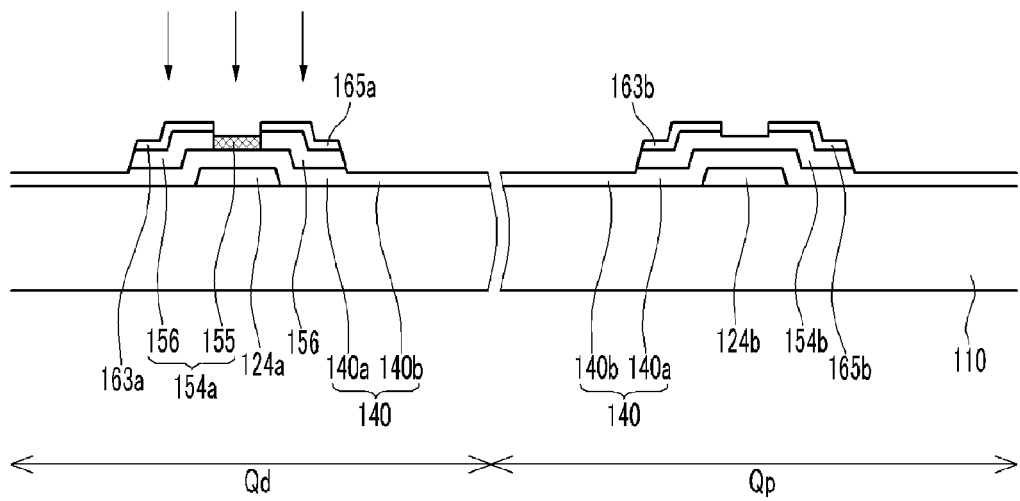

Referring to FIG. 17, the first photoresist pattern 41a is removed and the laser is irradiated to the circuit semiconductor 154a by using the ohmic contacts 163 a and 165a as a mask. Here, the exposed portion between the ohmic contacts 163a and 165a among the circuit semiconductor 154a is crystallized, and the portion disposed under the ohmic contacts 163a and 165a is not crystallized because of the blocking of the laser by the ohmic contacts 163a and 165a and remains with the amorphous state. Accordingly, as shown in FIG. 17, the circuit semiconductor 154a is divided into the first portion 155 made of polysilicon and the second portion 156 that is not crystallized and remains as amorphous silicon.

The hydrogen plasma is then treated on the entire surface of the substrate 110.

Figure 18:
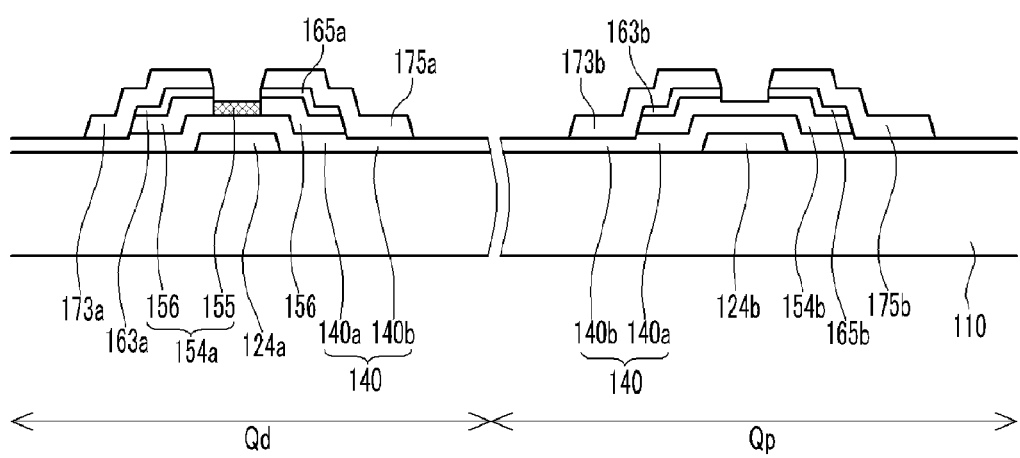

Next, referring to FIG. 18, a conductive layer is deposited on the ohmic contacts 163a, 165a, 163b, and 165b and the gate insulating layer 140 and patterned by photolithography to form a data line (not shown) including a display input electrode 173b, a display output electrode 175b, a circuit input electrode 173a, and a circuit output electrode 175a.

Figure 19:
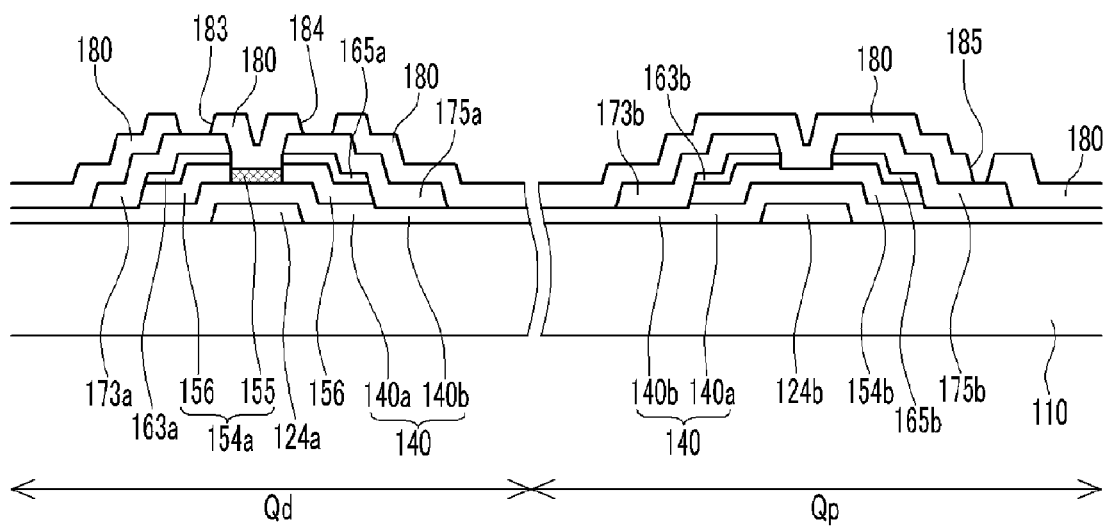

Next, referring to FIG. 19, a passivation layer 180 is formed on the entire surface of the substrate 110 and patterned to form a plurality of contact holes 183, 184, and 185.

Then, referring to FIG. 12, a conductive layer is deposited on the passivation layer 180 and patterned by photolithography to form a plurality of conductors 192 and 193 and a pixel electrode 191.

After forming the passivation layer 180 or the conductor 192 and 193 and the pixel electrode 191, the substrate may be annealed.

Next, another exemplary embodiment of the present invention will be described with reference to FIG. 20 to FIG. 22. The present exemplary embodiment relates to an active matrix OLED display. The same features are indicated by the same reference numerals as in previous exemplary embodiment mentioned above and therefore, a detailed description thereof is omitted.

Figure 20:
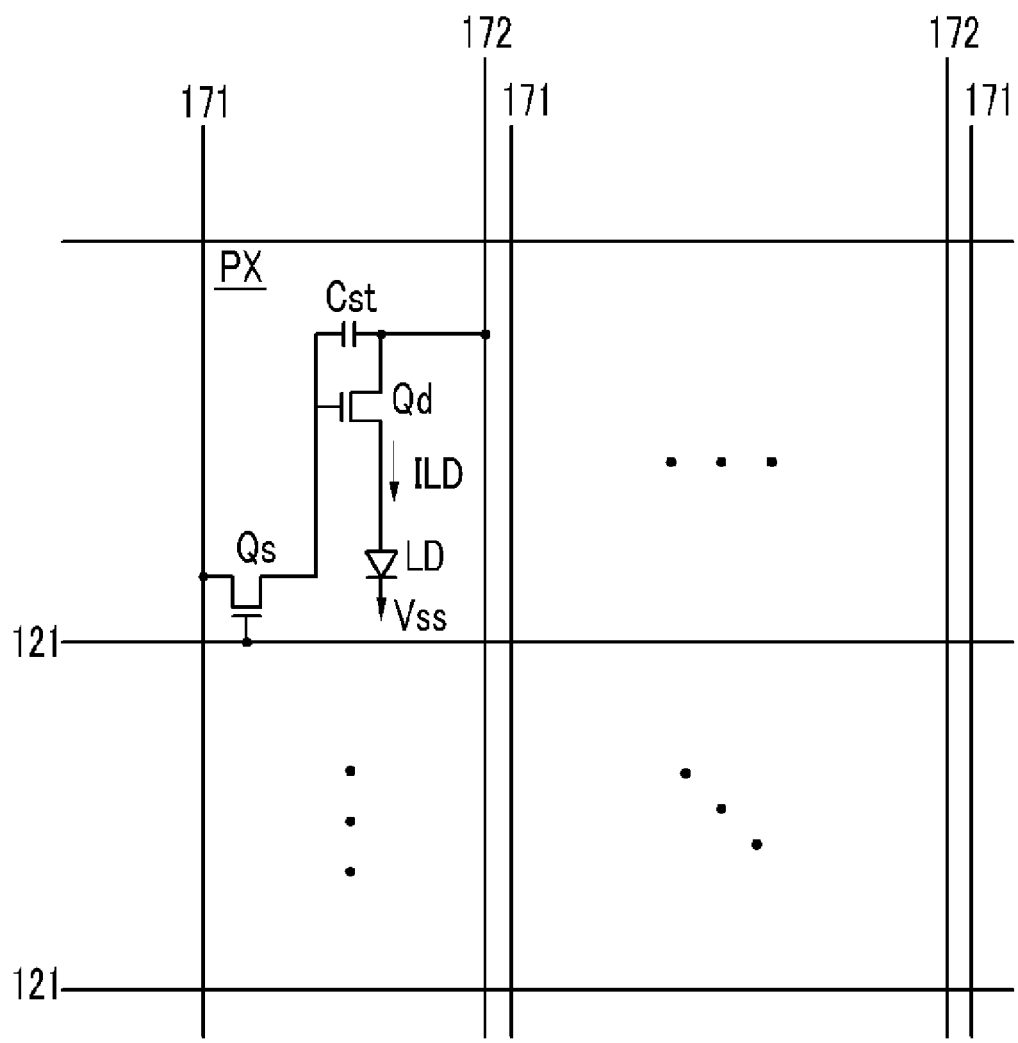
FIG. 20 is an equivalent circuit diagram of an exemplary embodiment of an OLED display according to the present invention.

FIG. 20 is an equivalent circuit diagram of an OLED display according to an exemplary embodiment of the present invention.

Referring to FIG. 20, an OLED display according to the present exemplary embodiment includes a plurality of signal lines 121, 171, and 172 and a plurality of pixels PX connected thereto and approximately arranged in a matrix form.

The signal lines include a plurality of gate signal lines 121 which transmit gate signals (or scanning signals), a plurality of data signal lines 171 which transmit data signals, and a plurality of driving voltage lines 172 which transmit a driving voltage. The gate signal lines 121 extend substantially in a row direction and substantially parallel to each other, and the data lines 171 and the driving voltage lines 172 extend substantially in a column direction and substantially parallel to each other.

Each pixel PX includes a switching transistor Qs, a driving transistor Qdd, a storage capacitor Cst, and an organic light emitting diode (OLED) LD.

The switching transistor Qs includes a control terminal connected to one of the gate lines 121, an input terminal connected to one of the data lines 171, and an output terminal connected to the driving transistor Qdd. The switching transistor Qs transmits the data signals applied to the data line 171 to the driving transistor Qdd in response to a gate signal applied to the gate line 121.

The driving transistor Qdd includes a control terminal connected to the switching transistor Qs, an input terminal connected to the driving voltage line 172, and an output terminal connected to the organic light emitting diode LD. The driving transistor Qdd drives an output current ILD having a magnitude depending on the voltage between the control terminal and the output terminal thereof, and outputs it to the OLED LD.

The storage capacitor Cst is connected between the control terminal and the input terminal of the driving transistor Qd. The capacitor Cst stores a data signal applied to the control terminal of the driving transistor Qdd and maintains the data signal after the switching transistor Qs turns off.

The OLED LD includes an anode connected to the output terminal of the driving transistor Qdd and a cathode connected to a common voltage Vss. The OLED LD emits light having an intensity depending on an output current ILD of the driving transistor Qdd, thereby displaying images.

The switching transistor Qs and the driving transistor Qdd are n-channel field effect transistors ("FETs"). However, at least one of the switching transistor Qs and the driving transistor Qd may be a p-channel FET. In addition, the connections among the transistors Qs and Qd, the capacitor Cst, and the organic light emitting diode LD may be modified.

Now, the structure of the organic light emitting device will be described in detail with reference to FIG. 21 and FIG. 22 along with FIG. 20.

Figure 21:
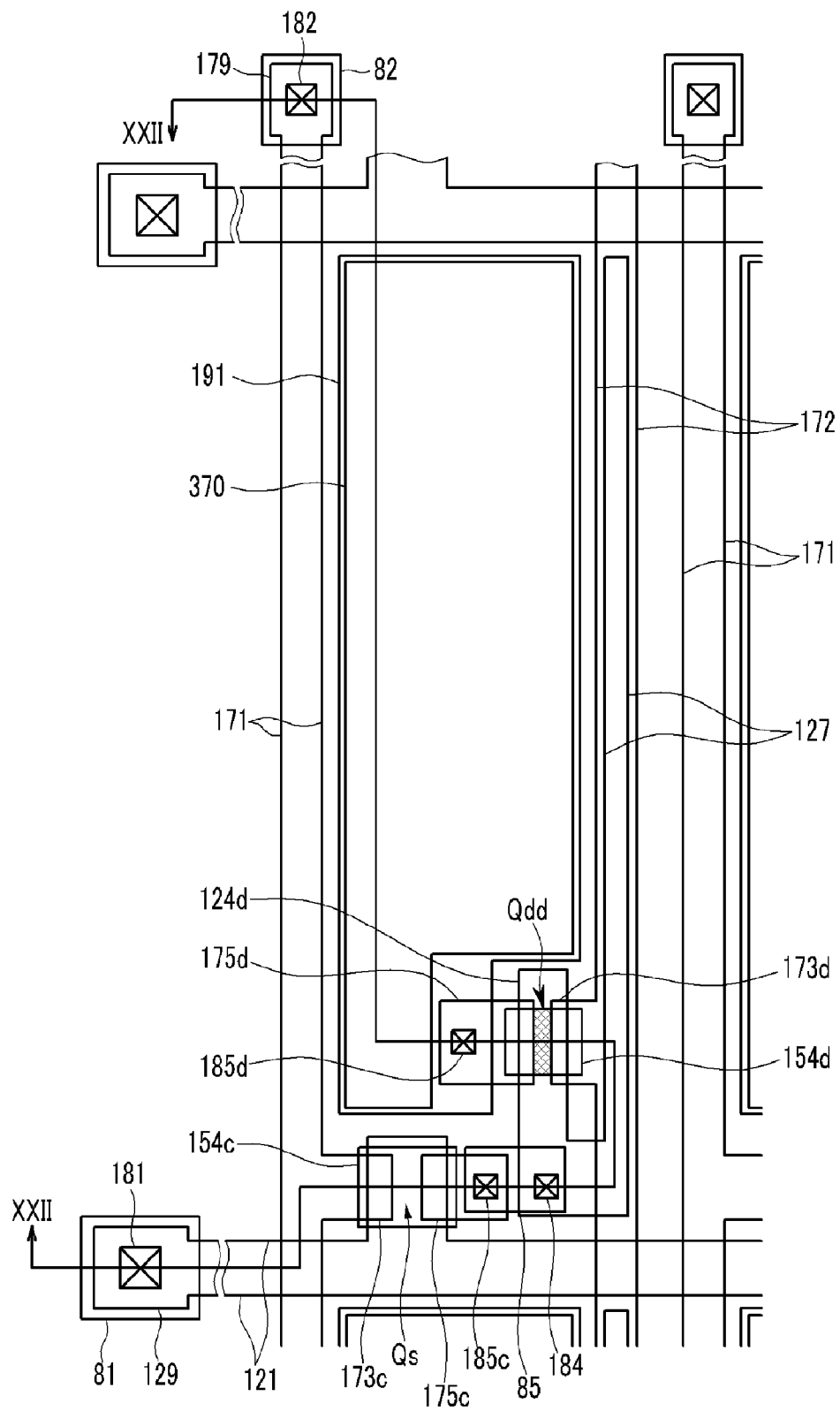
FIG. 21 is a layout view of another exemplary embodiment of an OLED display according to the present invention.
Figure 22:
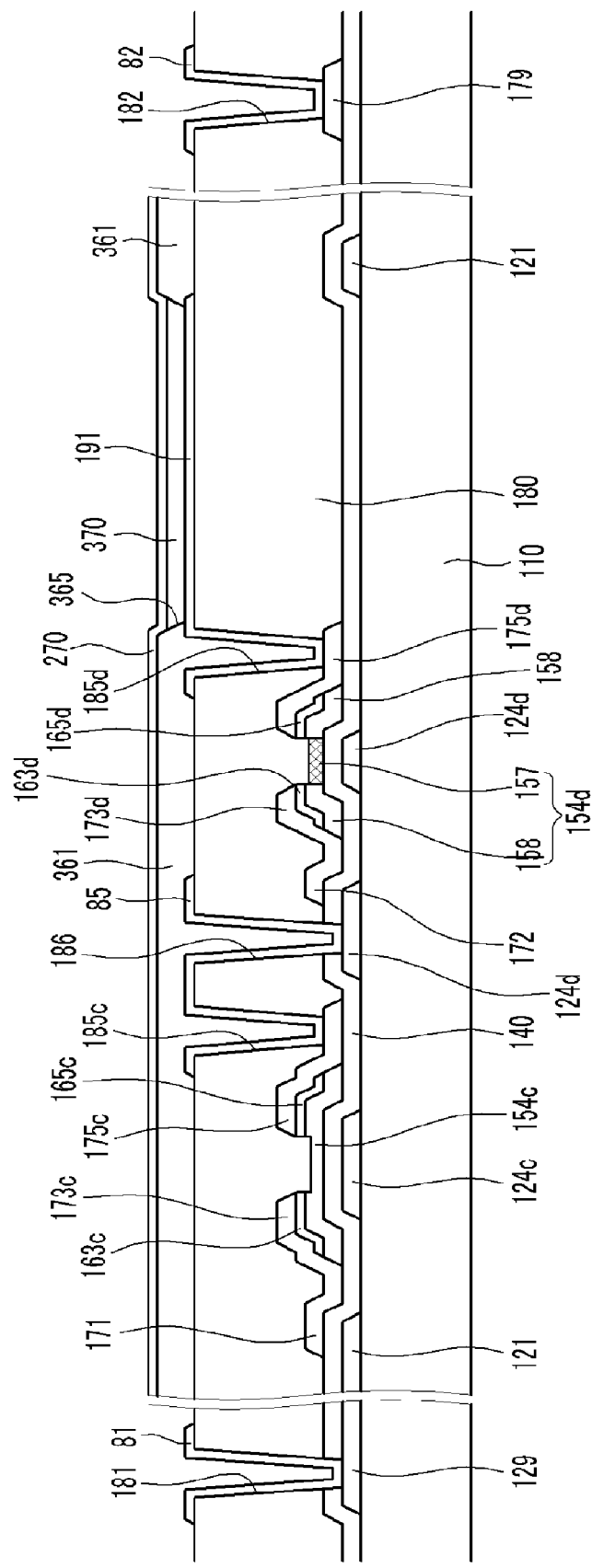
FIG. 22 is a cross-sectional view of the OLED display shown in FIG. 21 taken along the line XXII-XXII.

FIG. 21 is a layout view of an OLED display according to the current exemplary embodiment of the present invention, and FIG. 22 is a cross-sectional view of the OLED display shown in FIG. 21 taken along the line XXII-XXII.

Hereafter, the term "switching" is used for the switching thin film transistor Qs and the term "driving" is used for the driving thin film transistor Qdd.

A plurality of gate lines 121 and a plurality of driving control electrodes 124d are formed on an insulating substrate 110.

The gate lines 121 transfer gate signals and extend substantially in a horizontal direction. Each gate line 121 includes a plurality of switching control electrodes 124c that are protruded upward and a large end portion 129 for connection with a different layer or an external driving circuit.

The driving control electrodes 124d are separated from the gate lines 121 and include a plurality of storage electrodes 127 extending in one direction.

In the current exemplary embodiment, a gate insulating layer 140 is made of silicon nitride or silicon oxide is formed on the gate lines 121 and the driving control electrodes 124d.

A switching semiconductor 154c and a driving semiconductor 154d are formed on the gate insulating layer 140. The switching semiconductor 154c overlaps the switching control electrode 124c, and is made of hydrogenated amorphous silicon. The driving semiconductor 154d overlaps the driving control electrode 124d, and includes a first portion 157 made of polysilicon and a second portion 158 made of hydrogenated amorphous silicon.

A pair of ohmic contacts 163c and 165c are formed on the switching semiconductor 154c, and a pair of ohmic contacts 163d and 165d are formed on the driving semiconductor 154d.

Further, a plurality of data lines 171, a plurality of driving voltage lines 172, a plurality of switching output electrodes 175c, and a plurality of driving output electrodes 175d are formed on the ohmic contacts 163c, 163c, 165d, and 165d and the gate insulating layer 140.

The data lines 171 transmit data signals and extend in a vertical direction while intersecting the gate lines 121. Each of the data lines 171 includes a plurality of switching input electrodes 173c extending toward the switching control electrode 124c and an end portion 179 having a large area for contact with another layer or an external driving circuit.

The driving voltage lines 172 transmit driving voltages and extend in a vertical direction while intersecting the gate lines 121. Each driving voltage line 172 includes a plurality of driving input electrodes 173d extending toward the driving control electrode 124d and the portion overlapped with the storage electrodes 127.

The switching and driving output electrodes 175c and 175d are separated from each other, and are also separated from the data lines 171 and the driving voltage lines 172.

The switching input electrode 173c and the switching output electrode 175c are opposite to each other on the switching semiconductor 154c by a predetermined interval therebetween and the portion of switching semiconductor 154c is exposed therebetween.

The driving input electrode 173d and the driving output electrode 175d are opposite to each other on the driving semiconductor 154d by a predetermined interval therebetween, and the first portion 157 of the driving semiconductor 154d is exposed therebetween. In the current exemplary embodiment, the predetermined interval between the driving input electrode 173d and the driving output electrode 175d is the same as the width of the first portion 157 of the driving semiconductor 154d.

The first portion 157 of the driving semiconductor 154d is disposed between the driving input electrode 173d and the driving output electrode 175d, and the second portion 158 of the driving semiconductor 154d is disposed under the driving input electrode 173d and the driving output electrode 175d.

A passivation layer 180 is formed on the switching input electrode 173c, the switching output electrode 175c, the driving input electrode 173d, and the driving output electrode 175d. The passivation layer 180 includes a plurality of contact holes 182, 185c, and 185d respectively exposing the end portions 179 of the data lines 171 and the switching and driving output electrodes 175c and 175d, and the passivation layer 180 and the gate insulating layer 140 have a plurality of contact holes 181 and 184 respectively exposing the end portions 129 of the gate line 121 and the driving control electrodes 124d.

A plurality of pixel electrode 191, a plurality of connecting members 85 and a plurality of contact assistants 81 and 82 are formed on the passivation layer 180.

The pixel electrodes 191 are physically and electrically connected to the driving output electrode 175d through the contact holes 185d, and the connecting member 85 is connected to the driving control electrode 124d and the switching output electrode 175c through the contact holes 186 and 185c.

The contact assistants 81 and 82 are respectively connected to the end portions 121 and 171 of the gate lines 121 and the data lines 171 through the contact holes 181 and 182. The contact assistants 81 and 82 enhance the adhesion between the end portions 129 and 179 of the gate lines 121 and the data lines 171, and an external device, and protect them.

An insulating layer 361 is formed on the passivation layer 180. The insulating layer 361 has an opening 365 enclosing the edge of the pixel electrode 191.

An organic light emitting member 370 is formed in the opening 365. The organic light emitting member 370 may include an auxiliary layer (not shown) for improving light emitting efficiency, as well as light emission layers.

A common electrode 270 (see FIG. 2, for example) is formed on the organic light emitting member 370.

In an exemplary embodiment, an encapsulation layer (not shown) may be formed on the common electrode 270. The encapsulation layer encapsulates the organic light emitting member 370 and the common electrode 270 to keep moisture and/or oxygen from penetrating from the outside.

In the OLED display according to an exemplary embodiment, the switching control electrode 124c connected to the gate line 121, the switching input electrode 173c connected to the data line 171, and the switching output electrode 175c form the switching thin film transistor Qs along with the switching semiconductor 154c, and the channel of the switching thin film transistor Qs is formed on the switching semiconductor 154c.

The driving control electrode 124d which is connected to the switching output electrode 175c, the driving input electrode 173d which is connected to the driving voltage line 172, and the driving output electrode 175d which is connected to the pixel electrode 191 together form the driving thin film transistor Qdd along with the driving semiconductor 154d, and the channel of the driving thin film transistor Qdd is formed on the first portion 157 of the driving semiconductor 154d.

The pixel electrodes 191, the organic light emitting member 370, and the common electrode 270 together form organic light emitting diodes LD, wherein the pixel electrodes 191 are anodes and the common electrode 270 is a cathode, or where the pixel electrodes 191 are cathodes and the common electrode 270 is an anode. Also, the storage electrodes 127 and the driving voltage lines 172 that are overlapped form storage capacitors Cst.

Thus, according to an exemplary embodiment, the channel of the switching thin film transistor Qs is formed in the amorphous silicon such that leakage current is reduced and a reduction of the data voltage maybe prevented, and the channel of the driving thin film transistor Qdd is formed in the polysilicon such that improved carrier mobility and stability may be obtained, and accordingly the current amount of the light-emitting device is increased to thereby improve the luminance.

While the present invention has been shown and described with reference to some exemplary embodiments thereof, it should by understood by those of ordinary skill in the art that various changes in form and details may be made therein without departing from the spirit and scope of the present invention as defined by the appended claims.

What is claimed is:

1. A display device comprising:
a first thin film transistor comprises a first control electrode, a first semiconductor which overlaps the first control electrode, and a first input electrode and a first output electrode opposite to each other adjacent to the first semiconductor;
a second thin film transistor comprises a second control electrode, a second semiconductor which overlaps the second control electrode, and a second input electrode and a second output electrode opposite to each other on or under the second semiconductor; and
a gate insulating layer disposed between the first control electrode and the second control electrode and the first semiconductor and the second semiconductor;
wherein the first semiconductor comprises a first portion disposed between the first input electrode and the first output electrode, and having a first crystallinity, and a second portion which overlaps the first input electrode or the first output electrode and having a second crystallinity,
wherein the first crystallinity is higher than the second crystallinity,
wherein the gate insulating layer comprises a third portion disposed under the first semiconductor and the second semiconductor; and a fourth portion except for the third portion,
wherein the fourth portion is thinner than the third portion.

2. The display device of claim 1, wherein the second semiconductor comprises:
a fifth portion disposed between the second input electrode and the second output electrode; and
a sixth portion which overlaps the second input electrode and the second output electrode,
wherein the fifth portion and the sixth portion include amorphous semiconductor.

3. The display device of claim 2, wherein:
the first portion is thinner than the second portion; and
the third portion is thinner than the fourth portion.

4. The display device of claim 3, wherein
a thickness of the first portion is in a range of approximately 300 to approximately 1500 Å.

5. The display device of claim 2, wherein:
the first thin film transistor is disposed in a driving unit; and
the second thin film transistor is disposed in a display unit,
the driving unit comprises
a gate driver connected with a first signal line, and
a data driver connected with a second signal line intersecting the first signal line, and
the first signal line and the second signal line are connected with the second thin film transistor.

6. The display device of claim 2, further comprising:
a first electrode connected with the first thin film transistor;
a second electrode opposite to the first electrode; and
an emission layer formed between the first electrode and the second electrode,
the first control electrode is electrically connected with the second output electrode.

* * * * *